(12) United States Patent
Hietala et al.

(10) Patent No.: US 9,019,011 B2
(45) Date of Patent: Apr. 28, 2015

(54) METHOD OF POWER AMPLIFIER CALIBRATION FOR AN ENVELOPE TRACKING SYSTEM

(75) Inventors: Alexander Wayne Hietala, Phoenix, AZ (US); Nadim Khlat, Cugnaux (FR)

(73) Assignee: RF Micro Devices, Inc., Greensboro, NC (US)

( * ) Notice: Subject to any disclaimer, the term of this patent is extended or adjusted under 35 U.S.C. 154(b) by 285 days.

(21) Appl. No.: 13/486,012

(22) Filed: Jun. 1, 2012

(65) Prior Publication Data
US 2012/0306572 A1 Dec. 6, 2012

Related U.S. Application Data

(63) Continuation-in-part of application No. 13/150,346, filed on Jun. 1, 2011, now Pat. No. 8,866,549.

(60) Provisional application No. 61/493,189, filed on Jun. 3, 2011.

(51) Int. Cl.
*H03G 3/20* (2006.01)
*H03F 1/32* (2006.01)
*H03F 1/02* (2006.01)

(52) U.S. Cl.
CPC ............... *H03F 1/32* (2013.01); *H03F 1/0222* (2013.01)

(58) Field of Classification Search
USPC .................. 330/131, 297, 127, 129, 134, 279
See application file for complete search history.

(56) References Cited

U.S. PATENT DOCUMENTS

| | | |
|---|---|---|
| 3,969,682 A | 7/1976 | Rossum |
| 3,980,964 A | 9/1976 | Grodinsky |
| 4,587,552 A | 5/1986 | Chin |
| 4,692,889 A | 9/1987 | McNeely |
| 4,831,258 A | 5/1989 | Paulk et al. |
| 4,996,500 A | 2/1991 | Larson et al. |
| 5,099,203 A | 3/1992 | Weaver et al. |
| 5,146,504 A | 9/1992 | Pinckley |
| 5,187,396 A | 2/1993 | Armstrong, II et al. |

(Continued)

FOREIGN PATENT DOCUMENTS

| | | |
|---|---|---|
| CN | 1211355 A | 3/1999 |
| CN | 1898860 A | 1/2007 |

(Continued)

OTHER PUBLICATIONS

Notice of Allowance for U.S. Appl. No. 12/836,307 mailed May 5, 2014, 6 pages.

(Continued)

*Primary Examiner* — Hieu Nguyen
(74) *Attorney, Agent, or Firm* — Withrow & Terranova, P.L.L.C.

(57) ABSTRACT

A method for power amplifier (PA) calibration for an envelope tracking system of a wireless device is disclosed. The method involves measuring an output power of a PA that is a part under test (PUT) at a predetermined input power. Another step includes calculating a gain equal to the output power of the PA divided by the predetermined input power. A next step involves calculating a gain correction by subtracting the calculated gain from a desired gain. Other steps include determining an expected supply voltage for the PA at the desired gain using the gain correction applied to a nominal curve of gain versus PA supply voltage, and then storing the expected supply voltage for the PA versus input power in memory.

17 Claims, 17 Drawing Sheets

(56) References Cited

U.S. PATENT DOCUMENTS

| | | | |
|---|---|---|---|
| 5,311,309 A | 5/1994 | Ersoz et al. |
| 5,317,217 A | 5/1994 | Rieger et al. |
| 5,351,087 A | 9/1994 | Christopher et al. |
| 5,414,614 A | 5/1995 | Fette et al. |
| 5,420,643 A | 5/1995 | Romesburg et al. |
| 5,457,620 A | 10/1995 | Dromgoole |
| 5,486,871 A | 1/1996 | Filliman et al. |
| 5,532,916 A | 7/1996 | Tamagawa |
| 5,541,547 A | 7/1996 | Lam |
| 5,581,454 A | 12/1996 | Collins |
| 5,646,621 A | 7/1997 | Cabler et al. |
| 5,715,526 A | 2/1998 | Weaver, Jr. et al. |
| 5,767,744 A | 6/1998 | Irwin et al. |
| 5,822,318 A | 10/1998 | Tiedemann, Jr. et al. |
| 5,898,342 A | 4/1999 | Bell |
| 5,905,407 A | 5/1999 | Midya |
| 5,936,464 A | 8/1999 | Grondahl |
| 6,043,610 A | 3/2000 | Buell |
| 6,043,707 A | 3/2000 | Budnik |
| 6,055,168 A | 4/2000 | Kotowski et al. |
| 6,070,181 A | 5/2000 | Yeh |
| 6,118,343 A | 9/2000 | Winslow |
| 6,133,777 A | 10/2000 | Savelli |
| 6,141,541 A | 10/2000 | Midya et al. |
| 6,147,478 A | 11/2000 | Skelton et al. |
| 6,198,645 B1 | 3/2001 | Kotowski et al. |
| 6,204,731 B1 | 3/2001 | Jiang et al. |
| 6,256,482 B1 | 7/2001 | Raab |
| 6,300,826 B1 | 10/2001 | Mathe et al. |
| 6,313,681 B1 | 11/2001 | Yoshikawa |
| 6,348,780 B1 | 2/2002 | Grant |
| 6,483,281 B2 | 11/2002 | Hwang |
| 6,559,689 B1 | 5/2003 | Clark |
| 6,566,935 B1 | 5/2003 | Renous |
| 6,583,610 B2 | 6/2003 | Groom et al. |
| 6,617,930 B2 | 9/2003 | Nitta |
| 6,621,808 B1 | 9/2003 | Sadri |
| 6,624,712 B1 | 9/2003 | Cygan et al. |
| 6,658,445 B1 | 12/2003 | Gau et al. |
| 6,681,101 B1 | 1/2004 | Eidson et al. |
| 6,690,652 B1 | 2/2004 | Sadri |
| 6,701,141 B2 | 3/2004 | Lam |
| 6,703,080 B2 | 3/2004 | Reyzelman et al. |
| 6,728,163 B2 | 4/2004 | Gomm et al. |
| 6,744,151 B2 | 6/2004 | Jackson et al. |
| 6,819,938 B2 | 11/2004 | Sahota |
| 6,885,176 B2 | 4/2005 | Librizzi |
| 6,958,596 B1 | 10/2005 | Sferrazza et al. |
| 6,995,995 B2 | 2/2006 | Zeng et al. |
| 7,038,536 B2 | 5/2006 | Cioffi et al. |
| 7,043,213 B2 | 5/2006 | Robinson et al. |
| 7,053,718 B2 | 5/2006 | Dupuis et al. |
| 7,058,373 B2 | 6/2006 | Grigore |
| 7,099,635 B2 | 8/2006 | McCune |
| 7,164,893 B2 | 1/2007 | Leizerovich et al. |
| 7,170,341 B2 | 1/2007 | Conrad et al. |
| 7,200,365 B2 | 4/2007 | Watanabe et al. |
| 7,233,130 B1 | 6/2007 | Kay |
| 7,253,589 B1 | 8/2007 | Potanin et al. |
| 7,254,157 B1 | 8/2007 | Crotty et al. |
| 7,279,875 B2 | 10/2007 | Gan et al. |
| 7,394,233 B1 | 7/2008 | Trayling et al. |
| 7,405,618 B2 | 7/2008 | Lee et al. |
| 7,411,316 B2 | 8/2008 | Pai |
| 7,414,330 B2 | 8/2008 | Chen |
| 7,515,885 B2 | 4/2009 | Sander et al. |
| 7,528,807 B2 | 5/2009 | Kim et al. |
| 7,529,523 B1 | 5/2009 | Young et al. |
| 7,539,466 B2 | 5/2009 | Tan et al. |
| 7,595,569 B2 | 9/2009 | Amerom et al. |
| 7,609,114 B2 | 10/2009 | Hsieh et al. |
| 7,615,979 B2 | 11/2009 | Caldwell |
| 7,627,622 B2 | 12/2009 | Conrad et al. |
| 7,646,108 B2 | 1/2010 | Paillet et al. |
| 7,653,366 B2 | 1/2010 | Grigore |
| 7,679,433 B1 | 3/2010 | Li |
| 7,684,216 B2 | 3/2010 | Choi et al. |
| 7,696,735 B2 | 4/2010 | Oraw et al. |
| 7,715,811 B2 | 5/2010 | Kenington |
| 7,724,837 B2 | 5/2010 | Filimonov et al. |
| 7,773,691 B2 | 8/2010 | Khlat et al. |
| 7,777,459 B2 | 8/2010 | Williams |
| 7,782,036 B1 | 8/2010 | Wong et al. |
| 7,783,269 B2 | 8/2010 | Vinayak et al. |
| 7,800,427 B2 | 9/2010 | Chae et al. |
| 7,805,115 B1 | 9/2010 | McMorrow et al. |
| 7,859,336 B2 | 12/2010 | Markowski et al. |
| 7,880,547 B2 | 2/2011 | Lee et al. |
| 7,894,216 B2 | 2/2011 | Melanson |
| 7,898,268 B2 | 3/2011 | Bernardon et al. |
| 7,898,327 B2 | 3/2011 | Nentwig |
| 7,907,010 B2 | 3/2011 | Wendt et al. |
| 7,915,961 B1 | 3/2011 | Li |
| 7,923,974 B2 | 4/2011 | Martin et al. |
| 7,965,140 B2 | 6/2011 | Takahashi |
| 7,994,864 B2 | 8/2011 | Chen et al. |
| 8,000,117 B2 | 8/2011 | Petricek |
| 8,008,970 B1 | 8/2011 | Homol et al. |
| 8,022,761 B2 | 9/2011 | Drogi et al. |
| 8,026,765 B2 | 9/2011 | Giovannotto |
| 8,044,639 B2 | 10/2011 | Tamegai et al. |
| 8,068,622 B2 | 11/2011 | Melanson et al. |
| 8,081,199 B2 | 12/2011 | Takata et al. |
| 8,093,951 B1 | 1/2012 | Zhang et al. |
| 8,159,297 B2 | 4/2012 | Kumagai |
| 8,164,388 B2 | 4/2012 | Iwamatsu |
| 8,174,313 B2 | 5/2012 | Vice |
| 8,183,917 B2 | 5/2012 | Drogi et al. |
| 8,183,929 B2 | 5/2012 | Grondahl |
| 8,198,941 B2 | 6/2012 | Lesso |
| 8,204,456 B2 | 6/2012 | Xu et al. |
| 8,242,813 B1 | 8/2012 | Wile et al. |
| 8,274,332 B2 | 9/2012 | Cho et al. |
| 8,289,084 B2 | 10/2012 | Morimoto et al. |
| 8,362,837 B2 | 1/2013 | Koren et al. |
| 8,541,993 B2 | 9/2013 | Notman et al. |
| 8,542,061 B2 | 9/2013 | Levesque et al. |
| 8,548,398 B2 | 10/2013 | Baxter et al. |
| 8,558,616 B2 | 10/2013 | Shizawa et al. |
| 8,588,713 B2 | 11/2013 | Khlat |
| 8,611,402 B2 | 12/2013 | Chiron |
| 8,618,868 B2 | 12/2013 | Khlat et al. |
| 8,624,576 B2 | 1/2014 | Khlat et al. |
| 8,624,760 B2 | 1/2014 | Ngo et al. |
| 8,626,091 B2 | 1/2014 | Khlat et al. |
| 8,638,165 B2 | 1/2014 | Shah et al. |
| 8,648,657 B1 | 2/2014 | Rozenblit |
| 8,659,355 B2 | 2/2014 | Henshaw et al. |
| 8,718,582 B2 | 5/2014 | See et al. |
| 2002/0071497 A1 | 6/2002 | Bengtsson et al. |
| 2003/0017286 A1 | 1/2003 | Williams et al. |
| 2003/0031271 A1 | 2/2003 | Bozeki et al. |
| 2003/0062950 A1 | 4/2003 | Hamada et al. |
| 2003/0137286 A1 | 7/2003 | Kimball et al. |
| 2003/0198063 A1 | 10/2003 | Smyth |
| 2003/0206603 A1 | 11/2003 | Husted |
| 2003/0220953 A1 | 11/2003 | Allred |
| 2003/0232622 A1 | 12/2003 | Seo et al. |
| 2004/0047329 A1 | 3/2004 | Zheng |
| 2004/0051384 A1 | 3/2004 | Jackson et al. |
| 2004/0124913 A1 | 7/2004 | Midya et al. |
| 2004/0132424 A1 | 7/2004 | Aytur et al. |
| 2004/0184569 A1 | 9/2004 | Challa et al. |
| 2004/0196095 A1 | 10/2004 | Nonaka |
| 2004/0219891 A1 | 11/2004 | Hadjichristos |
| 2004/0239301 A1 | 12/2004 | Kobayashi |
| 2004/0266366 A1 | 12/2004 | Robinson et al. |
| 2004/0267842 A1 | 12/2004 | Allred |
| 2005/0008093 A1 | 1/2005 | Matsuura et al. |
| 2005/0032499 A1 | 2/2005 | Cho |
| 2005/0047180 A1 | 3/2005 | Kim |
| 2005/0064830 A1 | 3/2005 | Grigore |
| 2005/0093630 A1 | 5/2005 | Whittaker et al. |
| 2005/0110562 A1 | 5/2005 | Robinson et al. |

(56) References Cited

U.S. PATENT DOCUMENTS

| | | |
|---|---|---|
| 2005/0122171 A1 | 6/2005 | Miki et al. |
| 2005/0156582 A1 | 7/2005 | Redl et al. |
| 2005/0156662 A1 | 7/2005 | Raghupathy et al. |
| 2005/0157778 A1 | 7/2005 | Trachewsky et al. |
| 2005/0200407 A1 | 9/2005 | Arai et al. |
| 2005/0286616 A1 | 12/2005 | Kodavati |
| 2006/0006946 A1 | 1/2006 | Burns et al. |
| 2006/0062324 A1 | 3/2006 | Naito et al. |
| 2006/0097711 A1 | 5/2006 | Brandt |
| 2006/0128324 A1 | 6/2006 | Tan et al. |
| 2006/0178119 A1 | 8/2006 | Jarvinen |
| 2006/0181340 A1 | 8/2006 | Dhuyvetter |
| 2006/0220627 A1 | 10/2006 | Koh |
| 2006/0244513 A1 | 11/2006 | Yen et al. |
| 2007/0008804 A1 | 1/2007 | Lu et al. |
| 2007/0014382 A1 | 1/2007 | Shakeshaft et al. |
| 2007/0024360 A1 | 2/2007 | Markowski |
| 2007/0063681 A1 | 3/2007 | Liu |
| 2007/0082622 A1 | 4/2007 | Leinonen et al. |
| 2007/0146076 A1 | 6/2007 | Baba |
| 2007/0182392 A1 | 8/2007 | Nishida |
| 2007/0183532 A1 | 8/2007 | Matero |
| 2007/0259628 A1 | 11/2007 | Carmel et al. |
| 2007/0290749 A1 | 12/2007 | Woo et al. |
| 2008/0003950 A1 | 1/2008 | Haapoja et al. |
| 2008/0044041 A1 | 2/2008 | Tucker et al. |
| 2008/0081572 A1 | 4/2008 | Rofougaran |
| 2008/0104432 A1 | 5/2008 | Vinayak et al. |
| 2008/0150619 A1 | 6/2008 | Lesso et al. |
| 2008/0205095 A1 | 8/2008 | Pinon et al. |
| 2008/0242246 A1 | 10/2008 | Minnis et al. |
| 2008/0252278 A1 | 10/2008 | Lindeberg et al. |
| 2008/0258831 A1 | 10/2008 | Kunihiro et al. |
| 2008/0280577 A1 | 11/2008 | Beukema et al. |
| 2009/0004981 A1 | 1/2009 | Eliezer et al. |
| 2009/0097591 A1 | 4/2009 | Kim |
| 2009/0160548 A1 | 6/2009 | Ishikawa et al. |
| 2009/0167260 A1 | 7/2009 | Pauritsch et al. |
| 2009/0174466 A1 | 7/2009 | Hsieh et al. |
| 2009/0184764 A1 | 7/2009 | Markowski et al. |
| 2009/0190699 A1 | 7/2009 | Kazakevich et al. |
| 2009/0218995 A1 | 9/2009 | Ahn |
| 2009/0230934 A1 | 9/2009 | Hooijschuur et al. |
| 2009/0261908 A1 | 10/2009 | Markowski |
| 2009/0284235 A1 | 11/2009 | Weng et al. |
| 2009/0289720 A1 | 11/2009 | Takinami et al. |
| 2009/0319065 A1 | 12/2009 | Risbo |
| 2010/0001793 A1 | 1/2010 | Van Zeijl et al. |
| 2010/0002473 A1 | 1/2010 | Williams |
| 2010/0017553 A1 | 1/2010 | Laurencin et al. |
| 2010/0019749 A1 | 1/2010 | Katsuya et al. |
| 2010/0019840 A1 | 1/2010 | Takahashi |
| 2010/0026250 A1 | 2/2010 | Petty |
| 2010/0045247 A1 | 2/2010 | Blanken et al. |
| 2010/0171553 A1 | 7/2010 | Okubo et al. |
| 2010/0253309 A1 | 10/2010 | Xi et al. |
| 2010/0266066 A1 | 10/2010 | Takahashi |
| 2010/0301947 A1 | 12/2010 | Fujioka et al. |
| 2010/0308654 A1 | 12/2010 | Chen |
| 2010/0311365 A1 | 12/2010 | Vinayak et al. |
| 2010/0321127 A1 | 12/2010 | Watanabe et al. |
| 2010/0327825 A1 | 12/2010 | Mehas et al. |
| 2011/0018626 A1 | 1/2011 | Kojima |
| 2011/0058601 A1 | 3/2011 | Kim et al. |
| 2011/0084760 A1 | 4/2011 | Guo et al. |
| 2011/0148375 A1 | 6/2011 | Tsuji |
| 2011/0234182 A1 | 9/2011 | Wilson |
| 2011/0235827 A1 | 9/2011 | Lesso et al. |
| 2011/0279180 A1 | 11/2011 | Yamanouchi et al. |
| 2011/0298539 A1 | 12/2011 | Drogi et al. |
| 2012/0025907 A1 | 2/2012 | Koo et al. |
| 2012/0025919 A1 | 2/2012 | Huynh |
| 2012/0034893 A1 | 2/2012 | Baxter et al. |
| 2012/0049953 A1 | 3/2012 | Khlat |
| 2012/0068767 A1 | 3/2012 | Henshaw et al. |
| 2012/0074916 A1 | 3/2012 | Trochut |
| 2012/0133299 A1 | 5/2012 | Capodivacca et al. |
| 2012/0139516 A1 | 6/2012 | Tsai et al. |
| 2012/0154035 A1 | 6/2012 | Hongo et al. |
| 2012/0154054 A1 | 6/2012 | Kaczman et al. |
| 2012/0170334 A1 | 7/2012 | Menegoli et al. |
| 2012/0176196 A1 | 7/2012 | Khlat |
| 2012/0194274 A1 | 8/2012 | Fowers et al. |
| 2012/0200354 A1* | 8/2012 | Ripley et al. .................. 330/131 |
| 2012/0236444 A1 | 9/2012 | Srivastava et al. |
| 2012/0244916 A1 | 9/2012 | Brown et al. |
| 2012/0299647 A1 | 11/2012 | Honjo et al. |
| 2013/0034139 A1 | 2/2013 | Khlat et al. |
| 2013/0094553 A1 | 4/2013 | Paek et al. |
| 2013/0169245 A1 | 7/2013 | Kay et al. |
| 2013/0214858 A1 | 8/2013 | Tournatory et al. |
| 2013/0229235 A1 | 9/2013 | Ohnishi |
| 2013/0307617 A1 | 11/2013 | Khlat et al. |
| 2013/0328613 A1 | 12/2013 | Kay et al. |
| 2014/0009200 A1 | 1/2014 | Kay et al. |
| 2014/0009227 A1 | 1/2014 | Kay et al. |

FOREIGN PATENT DOCUMENTS

| | | |
|---|---|---|
| CN | 101201891 A | 6/2008 |
| CN | 101416385 A | 4/2009 |
| EP | 0755121 A2 | 1/1997 |
| EP | 1492227 A1 | 12/2004 |
| EP | 1569330 A1 | 8/2005 |
| EP | 2214304 A1 | 8/2010 |
| EP | 2244366 A1 | 10/2010 |
| EP | 2372904 A1 | 10/2011 |
| GB | 2462204 A | 2/2010 |
| GB | 2465552 A | 5/2010 |
| GB | 2484475 A | 4/2012 |
| TW | 461168 B | 10/2001 |
| WO | 0048306 A1 | 8/2000 |
| WO | 04002006 A1 | 12/2003 |
| WO | 2004082135 A2 | 9/2004 |
| WO | 2005013084 A2 | 2/2005 |
| WO | 2006021774 A1 | 3/2006 |
| WO | 2006070319 A1 | 7/2006 |
| WO | 2006073208 A1 | 7/2006 |
| WO | 2007107919 A1 | 9/2007 |
| WO | 2007149346 A2 | 12/2007 |
| WO | 2012151594 A2 | 11/2012 |
| WO | 2012172544 A1 | 12/2012 |

OTHER PUBLICATIONS

Notice of Allowance for U.S. Appl. No. 14/022,858 mailed May 27, 2014, 6 pages.
Non-Final Office Action for U.S. Appl. No. 13/367,973 mailed Apr. 25, 2014, 5 pages.
Non-Final Office Action for U.S. Appl. No. 13/647,815 mailed May 2, 2014, 6 pages.
Non-Final Office Action for U.S. Appl. No. 13/689,883 mailed Mar. 27, 2014, 13 pages.
Non-Final Office Action for U.S. Appl. No. 13/692,084 mailed Apr. 10, 2014, 6 pages.
Non-Final Office Action for U.S. Appl. No. 13/684,826 mailed Apr. 3, 2014, 5 pages.
Notice of Allowance for U.S. Appl. No. 14/022,940, mailed Jun. 10, 2014, 7 pages.
Non-Final Office Action for U.S. Appl. No. 13/714,600 mailed May 9, 2014, 14 pages.
Non-Final Office Action for U.S. Appl. No. 13/951,976 mailed Apr. 4, 2014, 7 pages.
Examination Report for European Patent Application No. 11720630.0 issued Mar. 18, 2014, 4 pages.
International Preliminary Report on Patentability for PCT/US2012/062070 mailed May 8, 2014, 8 pages.
International Search Report and Written Opinion for PCT/US2012/062110 issued Apr. 8, 2014, 12 pages.
International Preliminary Report on Patentability for PCT/US2012/062110 mailed May 8, 2014, 9 pages.

(56) References Cited

OTHER PUBLICATIONS

Notice of Allowance for U.S. Appl. No. 13/188,024, mailed Jun. 18, 2013, 8 pages.
International Preliminary Report on Patentability for PCT/US2011/054106 mailed Apr. 11, 2013, 8 pages.
International Preliminary Report on Patentability for PCT/US2011/061007 mailed May 30, 2013, 11 pages.
International Preliminary Report on Patentability for PCT/US2011/061009 mailed May 30, 2013, 10 pages.
Non-Final Office Action for U.S. Appl. No. 13/423,649, mailed May 22, 2013, 7 pages.
Advisory Action for U.S. Appl. No. 13/222,484, mailed Jun. 14, 2013, 3 pages.
International Preliminary Report on Patentability for PCT/US2011/064255, mailed Jun. 20, 2013, 7 pages.
Notice of Allowance for U.S. Appl. No. 13/343,840, mailed Jul. 1, 2013, 8 pages.
Non-final Office Action for U.S. Appl. No. 13/218,400 mailed Nov. 8, 2012, 7 pages.
Notice of Allowance for U.S. Appl. No. 13/316,229 mailed Nov. 14, 2012, 9 pages.
Non-final Office Action for U.S. Appl. No. 13/222,484 mailed Nov. 8, 2012, 9 pages.
International Preliminary Report on Patentability for PCT/US11/49243 mailed Nov. 13, 2012, 33 pages.
Non-final Office Action for U.S. Appl. No. 13/089,917 mailed Nov. 23, 2012, 6 pages.
Non final Office Action for U.S. Appl. No. 13/222,453 mailed Dec. 6, 2012, 13 pages.
International Preliminary Report on Patentability for PCT/US2011/033037 mailed Oct. 23, 2012, 7 pages.
Dixon, N., "Standardization boosts momentum for Envelope tracking," Microwave Engineers, Europe, Apr. 20, 2011, 2 pages.
Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.
Kim, N. et al, "Ripple feedback filter suitable for analog/digital mixed-mode audio amplifier for improved efficiency and stability," 33rd Annual Power Electronics Specialists Conference, vol. 1, Jun. 23, 2002, pp. 45-49.
Kim, D. et al., "High Efficiency and Wideband Envelope Tracking Power Amplifier with Sweet Spot Tracking," 2010 IEEE Radio Frequency Integrated Circuits Symposium, May 23-25, 2010, pp. 255-258.
Knutson, P, et al., "An Optimal Approach to Digital Raster Mapper Design," 1991 IEEE Transactions on Consumer Electronics held Jun. 5-7, 1991, vol. 37, Issue 4, published Nov. 1991, pp. 746-752.
Le, Hanh-Phuc et al., "A 32nm Fully Integrated Reconfigurable Switched-Capacitor DC-DC Converter Delivering 0.55W/mm$^2$ at 81% Efficiency," 2010 IEEE International Solid State Circuits Conference, Feb. 7-11, 2010, pp. 210-212.
Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.
Unknown, "Nujira files 100th envelope tracking patent," CS: Compound Semiconductor, Apr. 11, 2011, 1 page.
Non-final Office Action for U.S. Appl. No. 12/112,006 mailed Apr. 5, 2010, now Patent No. 7,884,681, 6 pages.
Notice of Allowance for U.S. Appl. No. 12/112,006 mailed Jul. 19, 2010, now Patent No. 7,884,681, 6 pages.
International Search Report for PCT/US2011/033037 mailed Aug. 9, 2011, 10 pages.
International Search Report for PCT/US2011/044857 mailed Oct. 24, 2011, 10 pages.
International Search Report for PCT/US11/49243 mailed Dec. 22, 2011, 9 pages.
International Search Report for PCT/US2011/064255 mailed Apr. 3, 2012, 12 pages.
Non-final Office Action for U.S. Appl. No. 11/113,873, now Patent No. 7,773,691 mailed Feb. 1, 2008, 17 pages.
Final Office Action for U.S. Appl. No. 11/113,873, now Patent No. 7,773,691, mailed Jul. 30, 2008, 19 pages.
Non-final Office Action for U.S. Appl. No. 11/113,873, now Patent No. 7,773,691, mailed Nov. 26, 2008, 22 pages.
Final Office Action for U.S. Appl. No. 11/113,873, now Patent No. 7,773,691, mailed May 4, 2009, 20 pages.
Non-final Office Action for U.S. Appl. No. 11/113,873, now Patent No. 7,773,691, mailed Feb. 3, 2010, 21 pages.
Notice of Allowance for U.S. Appl. No. 11/113,873, now Patent No. 7,773,691, mailed Jun. 9, 2010, 7 pages.
International Search Report for PCT/US06/12619 mailed May 8, 2007, 2 pages.
Extended European Search Report for application 06740532.4 mailed Dec. 27, 2010, 7 pages.
International Search Report for PCT/US2011/061009 mailed Feb. 8, 2012, 14 pages.
International Search Report for PCT/US2012/023495 mailed May 7, 2012, 13 pages.
Invitation to Pay Additional Fees and Where Applicable Protest Fee for PCT/US2011/061007 mailed Feb. 13, 2012, 7 pages.
Hekkala, A. et al., "Adaptive time misalignment compensation in envelope tracking amplifiers," International Symposium on Spread Spectrum Techniques and Applications, Aug. 2008, pp. 761-765.
Invitation to Pay Additional Fees and Where Applicable Protest Fee for PCT/US2012/024124 mailed Jun. 1, 2012, 7 pages.
Li et al., "A highly efficient SiGe differential power amplifier using an envelope-tracking technique for 3GPP LTE applications," IEEE Bipolar/BiCMOS Circuits and Technology Meeting (BCTM), Oct. 4-6, 2010, pp. 121-124.
Cidronali, A. et al., "A 240W dual-band 870 and 2140 MHz envelope tracking GaN PA designed by a probability distribution conscious approach," IEEE MTT-S International Microwave Symposium Digest, Jun. 5-10, 2011, 4 pages.
International Search Report for PCT/US2011/061007 mailed Aug. 16, 2012, 16 pages.
International Search Report for PCT/US2012/024124 mailed Aug. 24, 2012, 14 pages.
Wu, Patrick Y. et al., "A Two-Phase Switching Hybrid Supply Modulator for RF Power Amplifiers with 9% Efficiency Improvement," IEEE Journal of Solid-State Circuits, vol. 45, No. 12, Dec. 2010, pp. 2543-2556.
Yousefzadeh, Vahid et al., "Band Separation and Efficiency Optimization in Linear-Assisted Switching Power Amplifiers," 37th IEEE Power Electronics Specialists Conference, Jun. 18-22, 2006, pp. 1-7.
International Preliminary Report on Patentability for PCT/US2012/040317, mailed Dec. 12, 2013, 5 pages.
Notice of Allowance for U.S. Appl. No. 13/531,719, mailed Dec. 30, 2013, 7 pages.
Non-Final Office Action for U.S. Appl. No. 14/022,940, mailed Dec. 20, 2013, 5 pages.
International Search Report and Written Opinion for PCT/US2013/052277, mailed Jan. 7, 2014, 14 pages.
International Search Report for PCT/US2011/054106 mailed Feb. 9, 2012, 11 pages.
International Search Report for PCT/US12/40317 mailed Sep. 7, 2012, 7 pages.
International Search Report for PCT/US2012/046887 mailed Dec. 21, 2012, 12 pages.
Non-Final Office Action for U.S. Appl. No. 13/188,024, mailed Feb. 5, 2013, 8 pages.
International Search Report and Written Opinion for PCT/US2012/062070, mailed Jan. 21, 2013, 12 pages.
International Preliminary Report on Patentability for PCT/US2011/044857 mailed Mar. 7, 2013, 6 pages.
Notice of Allowance for U.S. Appl. No. 13/218,400 mailed Apr. 11, 2013, 7 pages.
Non-Final Office Action for U.S. Appl. No. 13/297,470 mailed May 8, 2013, 15 pages.

(56) References Cited

OTHER PUBLICATIONS

Notice of Allowance for U.S. Appl. No. 13/222,453 mailed Feb. 21, 2013, 7 pages.
Final Office Action for U.S. Appl. No. 13/222,484 mailed Apr. 10, 2013, 10 pages.
International Search Report and Written Opinion for PCT/US2012/053654 mailed Feb. 15, 2013, 11 pages.
International Search Report and Written Opinion for PCT/US2012/067230 mailed Feb. 21, 2013, 10 pages.
Notice of Allowance for U.S. Appl. No. 13/297,490, mailed Feb. 27, 2014, 7 pages.
Non-Final Office Action for U.S. Appl. No. 13/297,470, mailed Feb. 20, 2014, 16 pages.
Notice of Allowance for U.S. Appl. No. 13/550,049, mailed Mar. 6, 2014, 5 pages.
International Preliminary Report on Patentability for PCT/US2012/046887, mailed Jan. 30, 2014, 8 pages.
International Preliminary Report on Patentability for PCT/US2012/053654, mailed Mar. 13, 2014, 7 pages.
Non-Final Office Action for U.S. Appl. No. 13/661,552, mailed Feb. 21, 2014, 5 pages.
International Search Report and Written Opinion for PCT/US2013/065403, mailed Feb. 5, 2014, 11 pages.
Final Office Action for U.S. Appl. No. 13/297,470, mailed Oct. 25, 2013, 17 pages.
Notice of Allowance for U.S. Appl. No. 14/022,858, mailed Oct. 25, 2013, 9 pages.
Non-Final Office Action for U.S. Appl. No. 13/550,049, mailed Nov. 25, 2013, 6 pages.
Non-Final Office Action for U.S. Appl. No. 12/836,307, mailed Nov. 5, 2013, 6 pages.
Examination Report for European Patent Application No. 11720630, mailed Aug. 16, 2013, 5 pages.
International Preliminary Report on Patentability for PCT/US2012/024124, mailed Aug. 22, 2013, 8 pages.
International Preliminary Report on Patentability for PCT/US2012/023495, mailed Aug. 15, 2013, 10 pages.
Lie, Donald Y.C. et al., "Design of Highly-Efficient Wideband RF Polar Transmitters Using Envelope-Tracking (ET) for Mobile WiMAX/Wibro Applications," IEEE 8th International Conference on ASIC (ASCION), Oct. 20-23, 2009, pp. 347-350.
Lie, Donald Y.C. et al., "Highly Efficient and Linear Class E SiGe Power Amplifier Design," 8th International Conference on Solid-State and Integrated Circuit Technology (ICSICT), Oct. 23-26, 2006, pp. 1526-1529.
Notice of Allowance for U.S. Appl. No. 13/363,888, mailed Jul. 18, 2013, 9 pages.
Notice of Allowance for U.S. Appl. No. 13/222,453, mailed Aug. 22, 2013, 8 pages.
Non-Final Office Action for U.S. Appl. No. 13/367,973, mailed Sep. 24, 2013, 8 pages.
Notice of Allowance for U.S. Appl. No. 13/423,649, mailed Aug. 30, 2013, 8 pages.
Notice of Allowance for U.S. Appl. No. 13/316,229, mailed Aug. 29, 2013, 8 pages.
Quayle Action for U.S. Appl. No. 13/531,719, mailed Oct. 10, 2013, 5 pages.
Notice of Allowance for U.S. Appl. No. 13/550,060, mailed Aug. 16, 2013, 8 pages.
Notice of Allowance for U.S. Appl. No. 13/222,484, mailed Aug. 26, 2013, 8 pages.
Notice of Allowance for U.S. Appl. No. 13/602,856, mailed Sep. 24, 2013, 9 pages.
Hassan, Muhammad, et al., "A Combined Series-Parallel Hybrid Envelope Amplifier for Envelope Tracking Mobile Terminal RF Power Amplifier Applications," IEEE Journal of Solid-State Circuits, vol. 47, No. 5, May 1, 2012, pp. 1185-1198.
Hoversten, John, et al., "Codesign of PA, Supply, and Signal Processing for Linear Supply-Modulated RF Transmitters," IEEE Transactions on Microwave Theory and Techniques, vol. 60, No. 6, Jun. 2012, pp. 2010-2020.
European Search Report for Patent Application No. 14162682.0, issued Aug. 27, 2014, 7 pages.
International Preliminary Report on Patentability and Written Opinion for PCT/US2012/067230, mailed Jun. 12, 2014, 7 pages.
International Search Report and Written Opinion for PCT/US2014/028089, mailed Jul. 17, 2014, 10 pages.
Invitation to Pay Additional Fees and Partial International Search Report for PCT/US2014/028178, mailed Jul. 24, 2014, 7 pages.
Notice of Allowance for U.S. Appl. No. 14/072,140, mailed Aug. 27, 2014, 8 pages.
Non-Final Office Action for U.S. Appl. No. 14/072,225, mailed Aug. 15, 2014, 4 pages.
Notice of Allowance for U.S. Appl. No. 13/548,283, mailed Sep. 3, 2014, 7 pages.
Non-Final Office Action for U.S. Appl. No. 13/689,883, mailed Aug. 27, 2014, 12 pages.
Notice of Allowance for U.S. Appl. No. 13/661,552, mailed Jun. 13, 2014, 5 pages.
Notice of Allowance for U.S. Appl. No. 13/692,084, mailed Jul. 23, 2014, 7 pages.
Notice of Allowance for U.S. Appl. No. 13/690,187, mailed Sep. 3, 2014, 9 pages.
Notice of Allowance for U.S. Appl. No. 13/684,826, mailed Jul. 18, 2014, 7 pages.
Non-Final Office Action for U.S. Appl. No. 13/782,142, mailed Sep. 4, 2014, 6 pages.
Non-Final Office Action for U.S. Appl. No. 12/836,307, mailed Sep. 25, 2014, 5 pages.
Advisory Action for U.S. Appl. No. 13/297,470, mailed Sep. 19, 2014, 3 pages.
Non-Final Office Action for U.S. Appl. No. 13/297,470, mailed Oct. 20, 2014, 22 pages.
Notice of Allowance for U.S. Appl. No. 13/367,973, mailed Sep. 15, 2014, 7 pages.
Notice of Allowance for U.S. Appl. No. 13/647,815, mailed Sep. 19, 2014, 6 pages.
Non-Final Office Action for U.S. Appl. No. 13/661,227, mailed Sep. 29, 2014, 24 pages.
Notice of Allowance for U.S. Appl. No. 13/684,826, mailed Sep. 8, 2014, 6 pages.
Non-Final Office Action for U.S. Appl. No. 13/714,600, mailed Oct. 15, 2014, 13 pages.
Notice of Allowance for U.S. Appl. No. 13/914,888, mailed Oct. 17, 2014, 10 pages.
Non-Final Office Action for U.S. Appl. No. 13/747,725, mailed Oct. 7, 2014, 6 pages.
Extended European Search Report for European Patent Application No. 12794149.0, issued Oct. 29, 2014, 6 pages.
International Search Report and Written Opinion for PCT/US2014/012927, mailed Sep. 30, 2014, 11 pages.
International Search Report and Written Opinion for PCT/US2014/028178, mailed Sep. 30, 2014, 17 pages.
Notice of Allowance for U.S. Appl. No. 14/072,140, mailed Dec. 2, 2014, 8 pages.
Final Office Action for U.S. Appl. No. 13/689,883, mailed Jan. 2, 2015, 13 pages.
Notice of Allowance for U.S. Appl. No. 13/690,187, mailed Dec. 19, 2014, 8 pages.
Notice of Allowance for U.S. Appl. No. 13/747,694, mailed Dec. 22, 2014, 9 pages.
Notice of Allowance for U.S. Appl. No. 13/951,976, mailed Dec. 26, 2014, 9 pages.
Non-Final Office Action for U.S. Appl. No. 13/747,749, mailed Nov. 12, 2014, 32 pages.
First Office Action for Chinese Patent Application No. 201280026559.0, issued Nov. 3, 2014, 14 pages (with English translation).
Notice of Allowance for U.S. Appl. No. 13/948,291, mailed Feb. 11, 2015, 7 pages.

(56) References Cited

OTHER PUBLICATIONS

Notice of Allowance for U.S. Appl. No. 14/022,858, mailed Feb. 17, 2015, 7 pages.
Notice of Allowance for U.S. Appl. No. 14/072,225, mailed Jan. 22, 2015, 7 pages.
Final Office Action for U.S. Appl. No. 13/661,227, mailed Feb. 6, 2015, 24 pages.
Non-Final Office Action for U.S. Appl. No. 14/048,109, mailed Feb. 18, 2015, 8 pages.
Notice of Allowance for U.S. Appl. No. 13/747,725, mailed Feb. 2, 2015, 10 pages.
First Office Action for Chinese Patent Application No. 201180030273.5, issued Dec. 3, 2014, 15 pages (with English translation).
International Preliminary Report on Patentability for PCT/US2013/052277, mailed Feb. 5, 2015, 9 pages.

* cited by examiner

METHOD OF POWER AMPLIFIER CALIBRATION FOR AN ENVELOPE TRACKING SYSTEM

RELATED APPLICATIONS

This application claims the benefit of U.S. provisional patent application No. 61/493,189 filed Jun. 3, 2011, the disclosure of which is incorporated herein by reference in its entirety. This application is a continuation in part of U.S. patent application Ser. No. 13/150,346 filed Jun. 1, 2011, the disclosure of which is incorporated herein by reference in its entirety.

FIELD OF THE DISCLOSURE

The embodiments disclosed herein are related to calibration of radio frequency RF devices. In particular, the embodiments disclosed herein are related to calibration of RF devices configured for envelope tracking operation.

BACKGROUND

Traditionally, factory calibration of a radio frequency (RF) device having a linear power detector and an RF power amplifier requires measurements of the output power delivered by the RF power amplifier to a load, such as an antenna, and the power detector output voltage output. If the power detector is an idealized linear detector, the liner power detector may be characterized by measuring a first power detector output voltage at a first output power level and a second power detector output voltage at a second output power level. However, if the power detector is a non-linear power detector, a substantially higher number of measurements are typically required to characterize and calibrate the response of the non-linear power detector. As a result, the factory calibration of the RF device having a non-linear power detector may result in slower production rates or increased investment in calibration equipment.

Accordingly, there is a need to develop apparatuses and techniques to quickly characterize the non-linear response of a non-linear power detector of an RF device in order to calibrate the radio frequency power amplifier.

SUMMARY

Embodiments disclosed in the detailed description relate to apparatuses, computer readable media, and methods to quickly calibrate radio frequency devices that use a non-linear power detector to control the output power of a radio frequency power amplifier. As an example, one embodiment of a system for calibrating a non-linear power detector of a radio frequency device may use measurements of the non-linear power detector output and the associated RF power amplifier output level and a set of data points that characterizes a nominal non-linear power detector to calibrate the radio frequency device. The set of data points that characterizes the nominal non-linear power detector may be stored in a memory of a calibration system as nominal power detector output data. The measured non-linear power detector outputs, measured power amplifier output levels, and the nominal power detector output data may be used to determine a power detector error function that characterizes the difference between the response of the non-linear power detector and the nominal non-linear power detector. The power detector error function and the nominal power detector output data may be used to develop a calibrated power detector output data set. The calibrated power detector output data may be stored in the radio frequency device in order to calibrate the non-linear power detector.

One embodiment of a method for calibrating an electronic device includes providing a nominal data set including a plurality of nominal response data points. The plurality of nominal response data points may include a plurality of nominal input levels and a corresponding plurality of nominal output levels that characterize a desired response curve for the electric device. The method may further include obtaining a plurality of measured response data points, wherein each of the measured response data points includes a measured input level and a measured output level that corresponds to the measured input level. The method may further include adjusting the nominal data set based on the measured response data points and the nominal data set to generate a calibrated data set. The method may further include storing the calibrated data set in the electronic device to calibrate the electronic device.

Another embodiment of a method for calibrating a radio frequency device having a non-linear power detector may include providing nominal power detector output data including nominal power detector outputs and nominal power amplifier outputs to a calibration system, where each of the nominal power detector outputs is associated with one of the nominal power amplifier outputs. To calibrate the radio frequency device, the calibration system may instruct the radio frequency device to generate power amplifier output levels. For each of the power amplifier output levels generated by the radio frequency device, the calibration system may obtain a power detector output of the non-linear power detector and a power amplifier output of the radio frequency device that corresponds to the power detector output of the radio frequency device. The calibration system associates, for each of the power amplifier output levels generated by the radio frequency device, each power detector output of the non-linear power detector to one of the nominal power detector outputs based upon the power amplifier output of the radio frequency device that corresponds to the power detector output of the non-linear power detector. The calibration system calculates, for each power detector output of the non-linear power detector associated with one of the nominal power detector outputs, a measured power detector output error of measured power detector output errors based upon a difference between the power detector output and the one of the nominal power detector outputs associated with the power detector output, wherein each measured power detector output error is associated with one of the nominal power amplifier outputs. The calibration system calculates, for each of the plurality of nominal power detector outputs that is unassociated with one of the plurality of measured power detector output errors, a calculated power detector output error of a plurality of calculated power detector output errors based upon the plurality of measured power detector output errors and the plurality of nominal power amplifier outputs associated with the measured power detector output errors; wherein each calculated measured power detector output error is associated with one of the nominal power amplifier outputs. The calibration system generates calibrated power detector output data based upon the nominal power detector output data, the calculated power detector output errors, and the measured power detector output errors. The calibration system stores the calibrated power detector output data in the radio frequency device to calibrate the radio frequency device.

Another embodiment of a method for calibrating a radio frequency output of a radio frequency device having a non-linear power detector includes providing calibration system nominal power detector output data for a non-linear power detector of the radio frequency device to be calibrated. The nominal power detector output data may include nominal power detector outputs and nominal power amplifier outputs. Each of the nominal power detector outputs is associated with one of the nominal power amplifier outputs. The calibration system instructs the radio frequency device to generate power amplifier output levels. The calibration system obtains, for each power amplifier output level of the power amplifier output levels, a power detector output of the non-linear power detector and a power amplifier output of the radio frequency device that corresponds to the power amplifier output level, wherein each power amplifier output of the radio frequency device is associated with the power amplifier output level. The calibration system associates, for each power amplifier output level, the power detector output of the non-linear power detector to one of the nominal power detector outputs of the nominal power detector output data based upon the power amplifier output of the radio frequency device that corresponds to the power detector output of the non-linear power detector. The calibration system calculates, for each power detector output of the non-linear power detector associated with one of the nominal power detector outputs, a power detector output error based upon a difference between the power detector output level and the one of the nominal power detector outputs associated with the power detector output, wherein each power detector output error is associated with the one of the nominal power amplifier outputs. The calibration system determines a power detector error function based upon the power detector output errors and the associated ones of the nominal power amplifier outputs. The calibration system generates, for each nominal power amplifier output provided by the nominal power detector output data, calibrated power detector output data based upon the nominal power detector output data and the power detector error function. The calibration system stores the calibrated power detector output data in the radio frequency device to calibrate the radio frequency device.

Another embodiment of a calibration system includes a tangible computer readable medium embodying a program for using nominal power detector output data including nominal power detector outputs and nominal power amplifier outputs, where each of the nominal power detector outputs is associated with one of the nominal power amplifier outputs to calibrate a radio frequency device. The tangible computer medium includes computer executable instructions to calibrate a radio frequency output of a radio frequency device, wherein the computer executable instructions to configure the calibration system command the radio frequency device to generate power amplifier output levels. The instructions further configure the calibration system to obtain, for each of the power amplifier output levels generated by the radio frequency device, a power detector output of the non-linear power detector and a power amplifier output of the radio frequency device that corresponds to the power detector output of the non-linear power detector. The instructions further configure the calibration system to associate, for each of the power amplifier output levels generated by the radio frequency device, the power detector output of the non-linear power detector to one of the nominal power detector outputs based upon the power amplifier output of the radio frequency device that corresponds to the power detector output of the non-linear power detector. The instructions further configure the calibration system to calculate, for each power detector output of the non-linear power detector associated with one of the nominal power detector outputs, a measured power detector output error based upon a difference between the power detector output and the one of the nominal power detector outputs associated with the power detector output; wherein each measured power detector output error is associated with one of the nominal power amplifier outputs. The instructions further configure the calibration system to calculate, for each of the nominal power detector outputs that is unassociated with one of the measured power detector output errors, a calculated power detector output error based upon the measured power detector output errors and the nominal power amplifier outputs associated with the measured power detector output errors, wherein each calculated measured power detector output error is associated with one of the nominal power amplifier outputs. The instructions further configure the calibration system to generate calibrated power detector output data based upon the nominal power detector output data, the calculated power detector output errors, and the measured power detector output errors. The instructions further configure the calibration system to store the calibrated power detector output data in the radio frequency device to calibrate the radio frequency device.

Another embodiment of a calibration system includes a tangible computer readable medium embodying a program for using nominal power detector output data including nominal power detector outputs and nominal power amplifier outputs, where each of the nominal power detector outputs is associated with one of the nominal power amplifier outputs to calibrate a radio frequency device. The tangible computer medium includes computer executable instructions to calibrate a radio frequency output of a radio frequency device, wherein the computer executable instructions configure the calibration system to instruct the radio frequency device to generate power amplifier output levels. The instructions further configure the calibration system to obtain, for each power amplifier output level of the power amplifier output levels, a power detector output of the non-linear power detector and a power amplifier output of the radio frequency device that corresponds to the power amplifier output level, wherein each power amplifier output of the radio frequency device is associated with the power amplifier output level. The instructions further configure the calibration system to associate, for each power amplifier output level, the power detector output of the non-linear power detector to one of the nominal power detector outputs of the nominal power detector output data based upon the power amplifier output of the radio frequency device that corresponds to the power detector output of the non-linear power detector. The instructions further configure the calibration system to calculate, for each power detector output of the non-linear power detector associated with one of the nominal power detector outputs, a power detector output error based upon a difference between the power detector output level and the one of the nominal power detector outputs associated with the power detector output, wherein each power detector output error is associated with the one of the nominal power amplifier outputs. The instructions further configure the calibration system to determine a power detector error function based upon the power detector output errors and the associated ones of the nominal power amplifier outputs. The instructions further configure the calibration system to generate, for each nominal power amplifier output provided by the nominal power detector output data, a calibrated power detector output data based upon the nominal power detector output data and the power detector error function. The instructions further configure the calibration system to store the calibrated power detector output data in the radio frequency device to calibrate the radio frequency device.

Another embodiment of a method for calibrating an electronic device having a feedback circuit may include providing nominal response curve data to a calibration system used to calibrate the electronic device. The nominal response curve data may include nominal feedback outputs and nominal device outputs, where each of the nominal feedback outputs is associated with one of the nominal device outputs. The calibration system may instruct the electronic device to generate device output levels. For each device output level of the device output levels, the calibration system may obtain a measured feedback output and a measured device output of the electronic device that correspond to the device output level, wherein each measured device output of the electronic device is associated with the device output level. The calibration system may associate, for each device output level, the measured feedback output of the feedback circuit to one of the nominal feedback outputs of the nominal response curve data based upon a correspondence between the measured device output of the electronic device and one of the nominal feedback outputs in the nominal response curve data. The calibration system may calibrate, for each measured feedback output, a feedback output error based upon a difference between the measured feedback output and the one of the nominal feedback outputs associated with the measured feedback output, wherein each feedback output error is associated with the one of the nominal device outputs. The calibration system may determine a feedback error function based upon the feedback output errors and the associated ones of the nominal device outputs. The calibration system may generate, for each nominal device output provided by the nominal response curve data, calibrated response curve data based upon the nominal response curve data and the feedback error function. The calibration system may store the calibrated response curve data in the electronic device to calibrate the electronic device.

Yet another embodiment of the present disclosure provides a method of power amplifier (PA) calibration for an envelope tracking system. The envelope tracking system is configured to improve the efficiency of a PA that operates in third generation (3G) and fourth generation (4G) modes. In these modes of operation, the peak to average ratio (PAR) of a radio frequency (RF) signal output from the PA can become relatively large. For example, in high speed data modes, the PAR is typically around 6 to 8 dB, but in some cases can be a few dB higher.

In order to minimize distortion, the peak power of the RF signal must be at or near the saturated power of the PA. This means that the average power of the RF signal is significantly less than the peak power and thus the efficiency of the PA is degraded as compared to operation with signals in which the PAR is much lower.

In particular, a method for power amplifier (PA) calibration for an envelope tracking system of a wireless device is disclosed. The method involves measuring an output power of a PA that is a part under test (PUT) at a predetermined input power. Another step includes calculating a gain equal to the output power of the PA divided by the predetermined input power. A next step involves calculating a gain correction by subtracting the calculated gain from a desired gain. Other steps include determining an expected supply voltage for the PA at the desired gain using the gain correction applied to a nominal curve of gain versus PA supply voltage and then storing the expected supply voltage for the PA versus input power in memory. The method steps may be repeated until N expected supply voltages for the PA are stored.

The method continues by determining an N difference between an expected PA supply voltage and a nominal PA supply voltage value for an N input power and then determining an N+1 difference between a measured PA supply voltage and a nominal PA supply voltage value for an N+1 input power. The process continues by calculating a slope and an intercept for a line that yields calibration values as a function of PA supply voltage using the N difference, the N+1 difference, the N input power, the N+1 input power, and a nominal PA supply voltage for the N input power. The method may conclude by storing the calibration values for the PA supply voltage versus input power in a look up table memory that is accessible by the wireless device.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Embodiments disclosed herein relate to apparatuses, computer readable media, and methods to quickly calibrate radio frequency devices that use a non-linear power detector to control the output power of a radio frequency power amplifier. As an example, one embodiment of a method for calibrating an electronic device includes providing a nominal data set including a plurality of nominal response data points. The plurality of nominal response data points may include a plurality of nominal input levels and a corresponding plurality of nominal output levels that characterize a desired response curve for the electric device. The method may further include obtaining a plurality of measured response data points, wherein each of the measured response data points includes a measured input level and a measured output level that corresponds to the measured input level. The method may further include adjusting the nominal data set based on the measured response data points and the nominal data set to generate a calibrated data set. The method may further include storing the calibrated data set in the electronic device to calibrate the electronic device. Another embodiment of a system for calibrating a non-linear power detector of a radio frequency device may use measurements of the non-linear power detector output and the associated RF power amplifier output level and a set of data points that characterizes a nominal non-linear power detector to calibrate the radio frequency device. The set of data points that characterizes the nominal non-linear power detector may be stored in a memory of a calibration system as nominal power detector output data. The measured non-linear power detector outputs, measured power amplifier output levels, and the nominal power detector output data may be used to determine a power detector error function that characterizes the difference between the response of the non-linear power detector and the nominal non-linear power detector. The power detector error function and the nominal power detector output data may be used to develop a calibrated power detector output data set. The calibrated power detector output data may be stored in the non-linear power detector in order to calibrate the non-linear power detector.

Figure 1A:
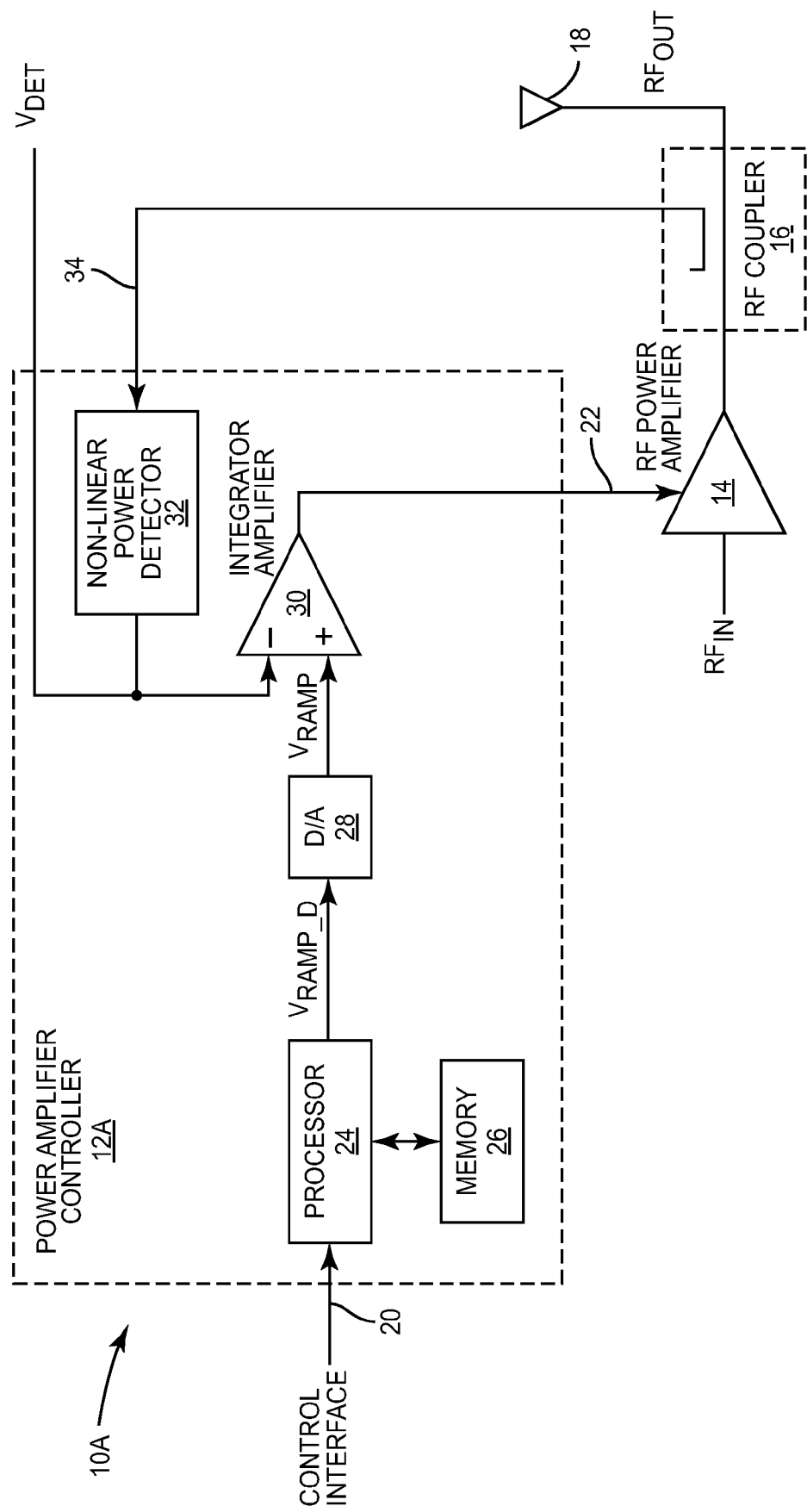
FIG. 1A depicts an example embodiment of an RF device having a power amplifier controller used to control the output power of an RF power amplifier.

FIG. 1A depicts an example embodiment of an RF device 10A having a power amplifier controller 12A used to control the output power of an RF power amplifier 14. The RF power amplifier is configured to receive an RF input signal, $RF_{IN}$, and provide an RF output signal, $RF_{OUT}$. The RF power amplifier 14 is coupled through an RF coupler 16 to an antenna 18. The coupler 16 senses the RF output signal, $RF_{OUT}$, and provides an input to the power amplifier controller 12A. The power amplifier controller 12A further includes a control interface 20, which may be used to control the operation of the power amplifier controller 12A. The power amplifier controller 12A may provide a power level control signal 22 to the RF power amplifier 14. The power level control signal 22 may be used to govern the output power level of the RF power amplifier 14. The output power level of the RF power amplifier 14 may be referred to as a power amplifier output level.

The power amplifier controller 12A includes a processor 24 coupled to a memory 26. The processor 24 may be in communication with the control interface 20 and configured to provide a digital $V_{RAMP}$ signal, $V_{RAMP\_D}$, to a digital-to-analog converter (D/A), 28. The processor 24 may control the output power level of the RF power amplifier 14 by setting the value of the digital $V_{RAMP}$ signal, $V_{RAMP\_D}$. The processor may include control logic, state machines, programmable logic devices, discrete gates or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices. As an example, a combination of computing devices may include a combination of a Digital Signal Processor (DSP) and a microprocessor, a plurality of microprocessors, one or more microprocessors in conjunction with a DSP core, or any other such configuration.

The memory 26 may include Random Access Memory (RAM), flash memory, Read Only Memory (ROM), Electrically Programmable ROM (EPROM), Electrically Erasable Programmable ROM (EEPROM), registers, and/or other types of memory as known in the art.

The digital-to-analog converter (D/A) 28 generates a $V_{RAMP}$ signal for controlling the power output level of the RF power amplifier 14. The $V_{RAMP}$ signal may represent a signal that contains the required supply modulation information for a power amplifier collector of the RF power amplifier 14, and is used to generate the power level control signal 22. During normal operation of the RF device 10A, the digital $V_{RAMP}$ signal, $V_{RAMP\_D}$, may be generated in order to set the RF output signal, $RF_{OUT}$ to a desired output power level during transmission of the RF input signal, $RF_{IN}$. During calibration, the digital $V_{RAMP}$ signal, $V_{RAMP\_D}$, may be set via the control interface 20 in order to instruct the RF power amplifier 14 to output a desired output power level into a load such as an antenna 18. The digital $V_{RAMP}$ signal, $V_{RAMP\_D}$, may be based upon a known RF modulation Amp(t)*cos(2*pi*$f_{RF}$*t+Phase(t)). The digital $V_{RAMP}$ signal, $V_{RAMP\_D}$, may represent a target supply voltage to be provided to the RF power amplifier 14.

The power amplifier controller 12A further includes an integrator amplifier 30 and a non-linear power detector 32. The integrator amplifier 30 may include a non-inverting input (+) and an inverting input (−). The integrator amplifier 30 may be configured to receive the $V_{RAMP}$ signal from the digital-to-analog converter 28 and a power detector output voltage, $V_{DET}$. The power detector output voltage, $V_{DET}$, represents the output power level of the RF power amplifier 14 as provided by the RF coupler 16 to the non-linear power detector 32. The integrator amplifier 30 may be configured to provide the power level control signal 22 to the RF power amplifier 14. The non-linear power detector 32 may be in communication with the coupler 16. The RF coupler 16 senses the RF output signal, $RF_{OUT}$, and provides a sensed $RF_{OUT}$ signal 34 to the non-linear power detector 32. Based upon the sensed $RF_{OUT}$ signal, the non-linear power detector 32 generates power detector output voltage, $V_{DET}$. The integrator amplifier 30 integrates the difference between the $V_{RAMP}$ signal and the power detector output voltage, $V_{DET}$, to generate the power level control signal 22. The integrator amplifier 30 may be configured to drive the difference between the $V_{RAMP}$ signal and the power detector output voltage, $V_{DET}$, to zero in order to set the desired output power level of the RF power amplifier 14.

In some embodiments of the RF device 10A, the power detector output voltage, $V_{DET}$, may be provided to an external pin of the RF device 10A for use during calibration. In other embodiments of the RF device 10A, the power detector output voltage, $V_{DET}$, is not provided to an external pin of the RF device 10A. In this case, during calibration of the RF device 10A, the value of the $V_{RAMP}$ signal may be used as a proxy for the power detector output voltage, $V_{DET}$, and it is assumed that the integrator amplifier 30 does not have a significant offset error between the non-inverting input of the integrator amplifier 30 and the inverting input of the integrator amplifier 30.

The memory 26 may be configured to store calibrated power detector output data. The calibrated power detector output data represents the response of the non-linear power detector 32 as determined during calibration of the RF device 10A. The calibrated power detector output data may include calibrated power detector outputs, $V_{DET\_CAL}$, and the power amplifier output levels associated with the calibrated power detector output, $V_{DET\_CAL}$. Each of the calibrated power detector outputs, $V_{DET\_CAL}$, represent a power detector output voltage, $V_{DET}$, that the non-linear power detector 32 generates for a particular power amplifier output power level sensed by the RF coupler 16. The processor 24 may use the calibrated detector output data to set the value of the digital $V_{RAMP}$ signal, $V_{RAMP\_D}$, during operation of the RF device 10A.

Figure 1B:
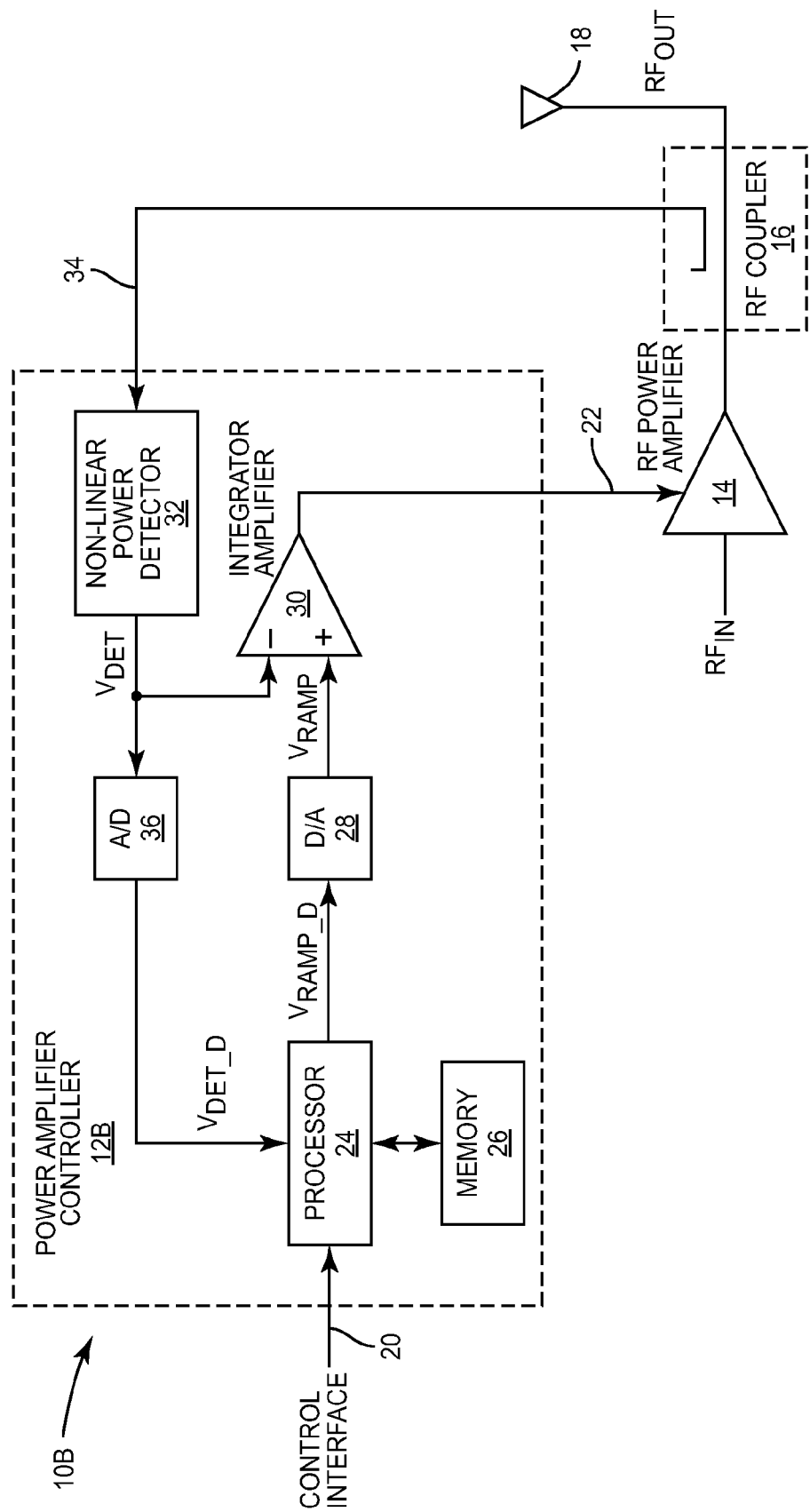
FIG. 1B depicts another example embodiment an RF device having a power amplifier controller used to control the output power of a RF power amplifier.

FIG. 1B depicts another example embodiment of an RF device 10B having a power amplifier controller 12B used to control the output power of an RF power amplifier 14. The power amplifier controller 12B is similar to the power amplifier controller 12A except that the power amplifier controller 12B may further include an analog-to-digital converter 36 configured to receive the power detector output voltage, $V_{DET}$. The analog-to-digital converter 36 digitizes the power detector output voltage, $V_{DET}$, to generate a digital power detector output voltage signal, $V_{DET\_D}$. The analog-to-digital converter 36 may be configured to provide the digital power detector output voltage signal, $V_{DET\_D}$, to the processor 24. During calibration of the RF device 10B, the value of the digital power detector output voltage signal, $V_{DET\_D}$, may be provided to an externally coupled device (not shown) via the control interface 20. Otherwise, operation of the power amplifier controller 12B is similar to the power amplifier controller 12A depicted in FIG. 1A.

Figure 1C:
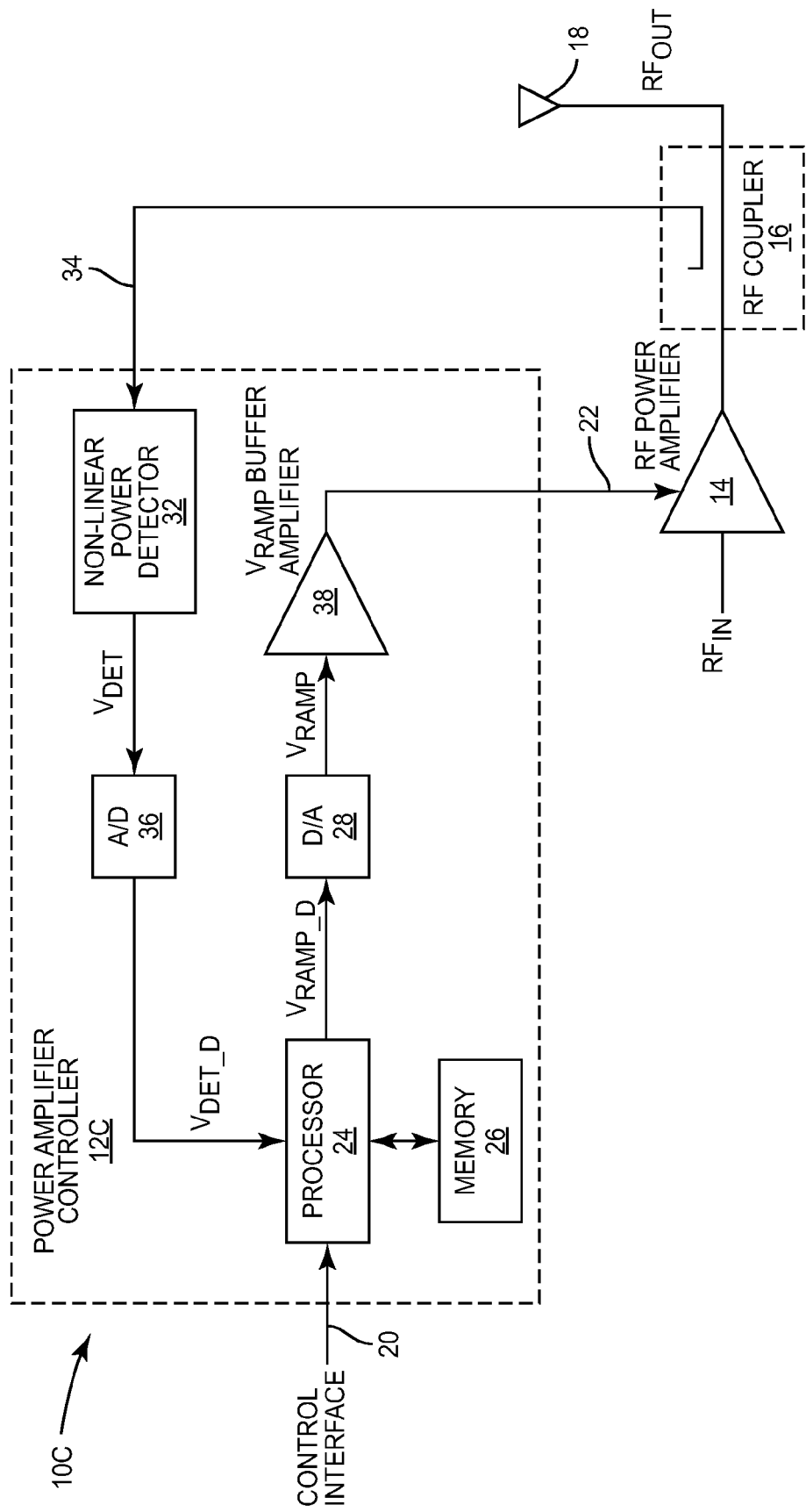
FIG. 1C depicts yet another example embodiment of an RF device having a power amplifier controller used to control the output power of a RF power amplifier.

FIG. 1C depicts yet another example embodiment of an RF device 10C having a power amplifier controller 12C used to control the output power of an RF power amplifier 14. The power amplifier controller 12C is similar to the power amplifier controller 12B, except the power amplifier controller 12C does not include the integrator amplifier 30, as depicted in FIG. 1B.

Instead, the power amplifier controller 12C includes a $V_{RAMP}$ buffer amplifier 38 configured to receive the $V_{RAMP}$ signal from the digital-to-analog converter 28. The $V_{RAMP}$ buffer amplifier 38 provides a power level control signal 22 to the RF power amplifier 14. The processor 24 uses the digital power detector output voltage signal, $V_{DET\_D}$, to determine a difference between the sensed $RF_{OUT}$ signal 34 and a desired output power level of the RF power amplifier 14. The processor 24 then changes the value of the digital power detector output voltage signal, $V_{DET\_D}$, to minimize the difference between the sensed $RF_{OUT}$ signal 34 and a desired output power level of the RF power amplifier 14.

Referring to FIGS. 1A, 1B, and 1C, in some example embodiments, the RF devices 10A, 10B, and 10C may be a mobile terminal. In other example embodiments, the RF devices 10A, 10B, and 10C, may be computing devices. In still other example embodiments, the RF devices 10A, 10B, and 10C, may be mobile telephones.

Figure 2A:
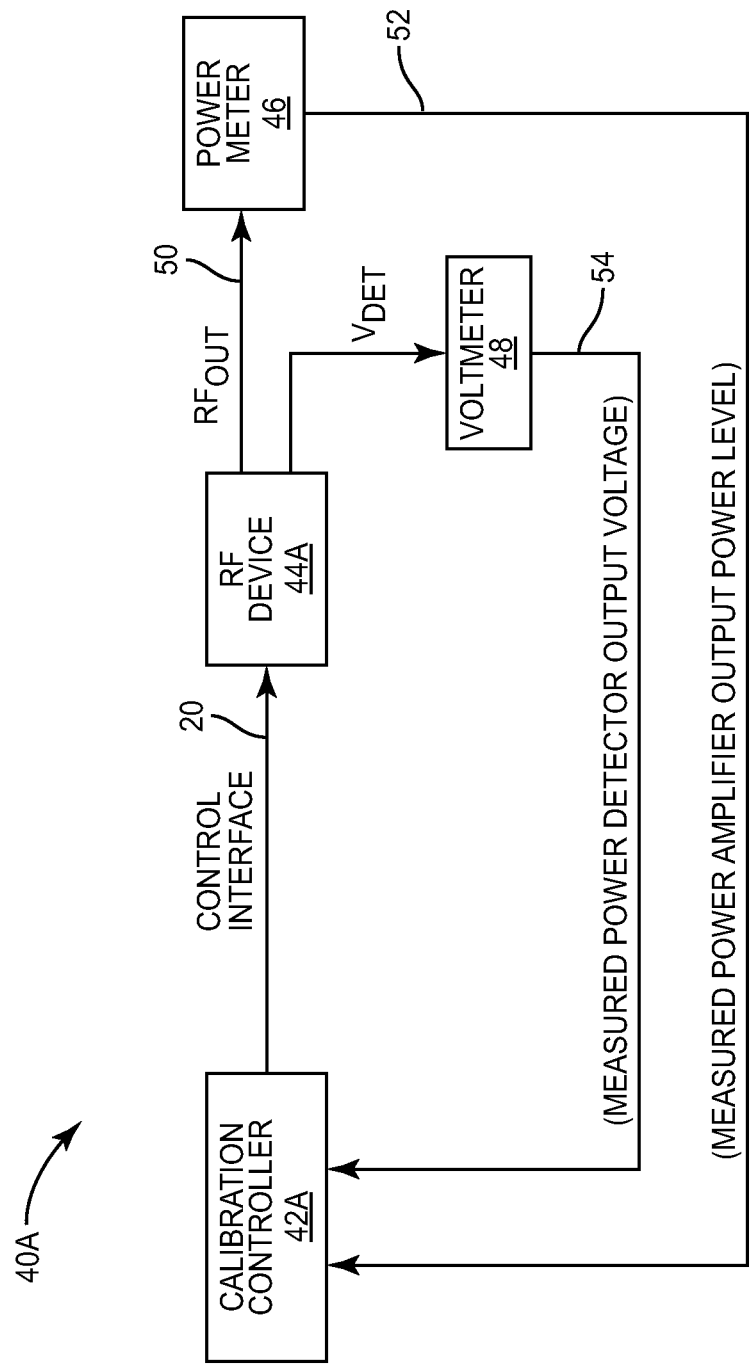
FIG. 2A depicts a first example embodiment of a calibration system for calibrating an RF device.

FIG. 2A depicts a first example embodiment of a calibration system 40A for calibrating an RF device 44A having a non-linear power detector. The calibration system 40A may include a calibration controller 42A, a power meter 46, and a voltmeter 48. The calibration system 40A may be configured to receive an RF device 44A to be calibrated and configured. As an example, the calibration system 40A may be installed in a factory and configured to calibrate RF devices during final assembly and inspection.

The calibration controller 42A may include a control interface 20 coupled to the RF device 44A. The RF device 44A may be similar to the RF device 10A of FIG. 1A, which provides the power detector output voltage, $V_{DET}$, at an external pin for use during calibration. The RF output signal, $RF_{OUT}$, of the RF device 44A is in communication with the power meter 46. In some embodiments of the calibration system 40A, the RF output signal, $RF_{OUT}$, of the RF device 44A is coupled to the power meter 46 via a controlled impedance line 50. The impedance of the controlled impedance line 50 and the input impedance of the power meter 46 may be configured to match the expected impedance of the antenna of the RF device 44A. As an example, the controlled impedance line 50 and the input impedance of the antenna of the RF device 44A may be configured to match a 50 ohm load. In this case, the antenna of the RF device 44A is either not yet installed or temporarily removed from the antenna port (not shown) of the RF device 44A. A controlled impedance line 50 is then attached to an antenna port (not shown) of the RF device 44A. The antenna port of the RF device 44A may be configured to receive the antenna. In other embodiments of the calibration system 40A, the RF device 44A is wirelessly coupled to the power meter 46. In this case, the power meter 46 includes an antenna (not shown) for receiving the RF output signal, $RF_{OUT}$, of the RF device 44A to be calibrated.

The power meter 46 may be configured to receive the RF output signal, $RF_{OUT}$. Based upon the received RF output signal, $RF_{OUT}$, the power meter 46 may be configured to provide a measured output power level, $P_{OUT}$, of the transmitted power of the RF output signal, $RF_{OUT}$, to the calibration controller 42A via a first communication interface 52. In some embodiments, the measured power amplifier output power level, $P_{OUT}$, may be provided to the calibration controller 42A in terms of power amplifier output voltage, $V_{OUT}$, which is the root-mean-square (RMS) voltage developed across the load that receives the RF output signal, $RF_{OUT}$. In some embodiments of the calibration controller 42A, the measured power amplifier output power level, $P_{OUT}$, is translated into terms of the power amplifier output voltage, $V_{OUT}$.

The voltmeter 48 may be configured to couple to the RF device 44A and receive the power detector output voltage, $V_{DET}$. The voltmeter 48 may be coupled to the calibration controller 42A via a second communication interface 54. The voltmeter 48 measures the received power detector output voltage, $V_{DET}$, and provides a measured value of the power detector output voltage, $V_{DET}$, to the calibration controller.

As will be described below, the calibration controller 42A may be configured to use the measured output power level, $P_{OUT}$, and the measured value of the power detector output voltage, $V_{DET}$ to calibrate the RF device 44A. The calibration controller 42A may include a computer or processor having memory. The computer or processor may include a Digital Signal Processor (DSP), an Application Specific Integrated Circuit (ASIC), a Field Programmable Gate Array (FPGA) or other programmable logic devices. The memory of the calibration controller 42A may be embodied in hardware and in instructions that are stored in memory, and may reside, for example, in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of computer readable medium known in the art. Instructions stored in the memory may include computer executable program code. An exemplary storage medium may be coupled to the processor such that a processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server. The calibration controller 42A may include hardware and/or instructions to execute or embody operational steps to be carried out by the calibration controller 42A. The operational steps to calibrate the RF device 44A may be performed in numerous different sequences. Furthermore, operations may actually be performed in a number of different steps.

Figure 3:
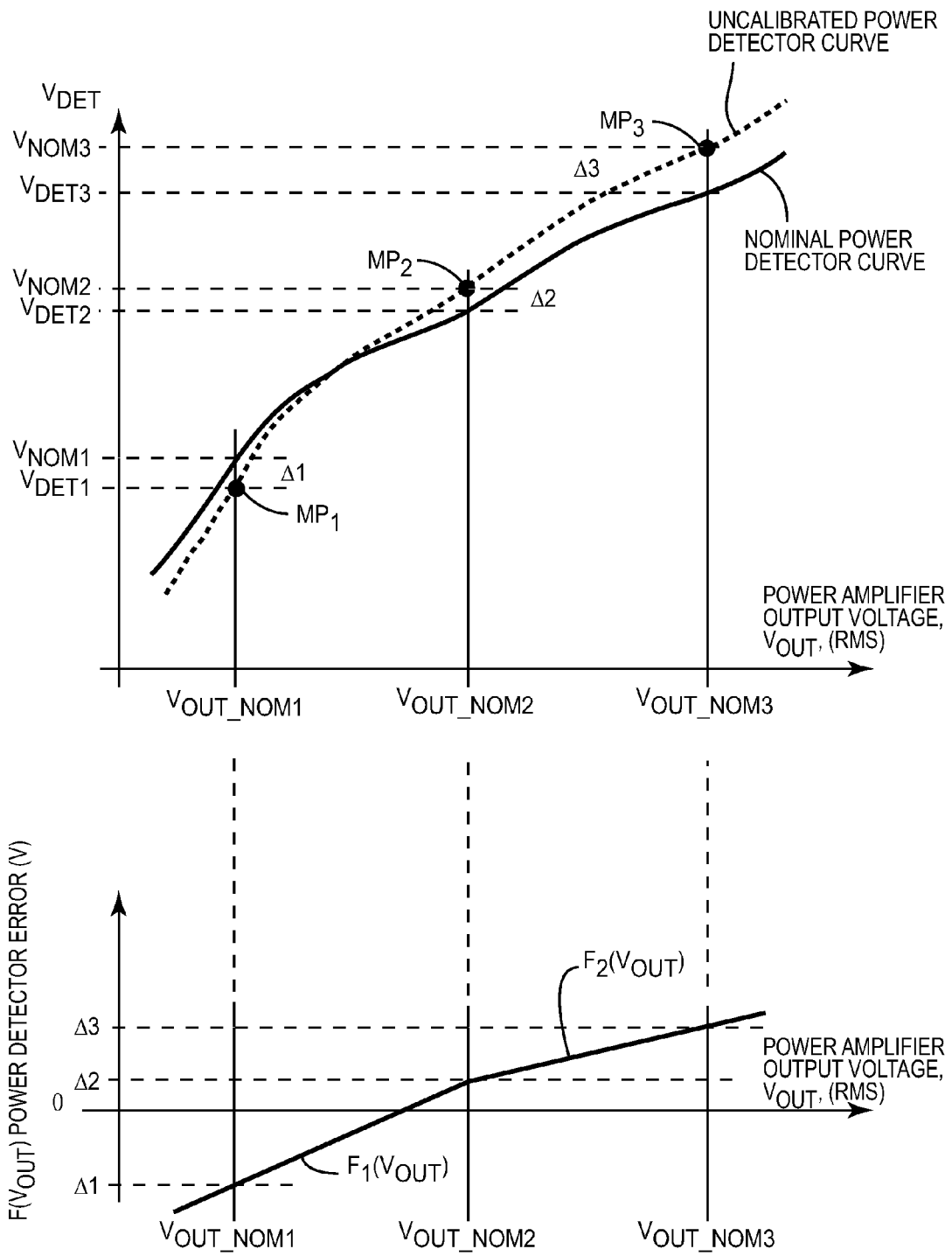
FIG. 3 depicts a relationship between a nominal power detector curve, an uncalibrated power detector curve, and a power detector error function.

The memory of the calibration controller 42A may include nominal power detector output data. The nominal power detector output data represents the expected nominal input-output relationship of a nominal non-linear power detector of a nominal RF device 44A. FIG. 3 depicts a nominal power detector curve (solid line) that may be generated based upon the nominal power detector output data. The nominal power detector curve (solid line) may include a nominal power detector output voltage, $V_{NOM}$ ($V_{OUT}$), of FIG. 3, for each output power level that the RF device 44A is expected to generate. As an example, the nominal power detector output data may include a nominal power detector output voltage, $V_{NOM}$ ($V_{OUT}$), for each power level specified in the European Telecommunication Standard Institute (ETSI) standard for the RF device 44A to be calibrated. As a further example, the nominal power detector output data may include a nominal power detector output voltage, $V_{NOM}$ ($V_{OUT}$), of FIG. 3, for each nominal power amplifier output level, $V_{OUT\_NOM}$, to be generated by the power amplifier of the RF device 44A. The relationship between the nominal power detector output voltage, $V_{NOM}$ ($V_{OUT\_NOM}$), and the nominal power amplifier output levels, $V_{OUT\_NOM}$, provide the nominal power detector curve (solid line) and represent an expected performance of the non-linear power detector of the RF device 44A. As an example, the first nominal power detector output voltage, $V_{NOM1}$, corresponds to a first nominal power amplifier output level, $V_{OUT\_NOM1}$. The second nominal power detector output voltage, $V_{NOM2}$, corresponds to a second nominal power amplifier output level, $V_{OUT\_NOM2}$. The third nominal power detector output voltage, $V_{NOM3}$, corresponds to a third nominal power amplifier output level, $V_{OUT\_NOM3}$.

Figure 2B:
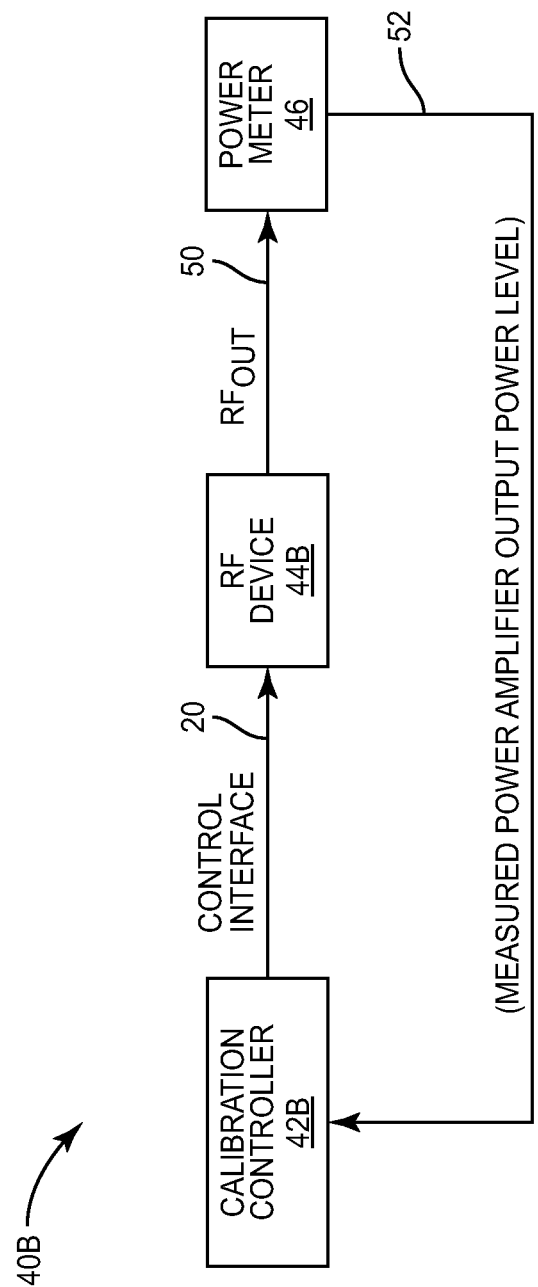
FIG. 2B depicts a second example embodiment of a calibration system for calibrating an RF device.

FIG. 2B depicts a second example embodiment of a calibration system 40B for calibrating an RF device 44B having a non-linear power detector. The calibration system 40B is similar to the calibration system 40A, of FIG. 2A, except that the calibration system 40B is configured to calibrate an RF device 44B that does not provide the power detector output voltage, $V_{DET}$, to an external pin that may be measured by a voltmeter. An example of the RF device 44B that does not provide the power detector output voltage, $V_{DET}$, to an external pin may include the RF device 10B of FIG. 1B or the RF device 10C of FIG. 1C. Instead, the calibration system 40B may be configured to read or receive the digital power detector output voltage signal, $V_{DET\_D}$, generated by the analog-to-digital converter 36. The calibration system 40B uses the value of the digital power detector output voltage signal, $V_{DET\_D}$, as the measured value of the power detector output voltage, $V_{DET}$.

Another example of an RF device 44B that does not provide the power detector output voltage, $V_{DET}$, to an external pin may include an embodiment of the RF device 44A of FIG. 2A that does not provide the power detector output voltage, $V_{DET}$, to an external pin. Instead, the calibration system 40B uses the value of the $V_{RAMP}$ signal as a proxy for the power detector output voltage, $V_{DET}$.

The calibration system 40B may include another embodiment of a calibration controller 42B. The calibration controller 42B is similar to the calibration controller 42A except there may not include a second communication interface 54 adapted to interface with a voltmeter. In addition, the calibration controller 42B may be configured to control the processor or access the memory of the RF device 44B that is to be calibrated. The calibration controller 42B may obtain the digital power detector output voltage signal, $V_{DET\_D}$, from either the processor 24 or memory 26 of the RF device 44B.

FIG. 3 further depicts a relationship between the nominal power detector curve (solid line), an uncalibrated power detector curve (dashed line), and a power detector error function. FIG. 3 will now be explained with continuing reference to the RF device 10A of FIG. 1A, the RF device 10B of FIG. 1B, or the RF device 10C of FIG. 1C. The uncalibrated power detector curve (dashed line) represents the input-output relationship of the non-linear power detector 32 of the RF device 10A, 10B, 10C, to be calibrated. FIG. 3 further includes a first measurement point, $MP_1$, a second measurement point, $MP_2$, and a third measurement point, $MP_3$. The first measurement point, $MP_1$, may represent the power detector output voltage, $V_{DET1}$, generated by the non-linear power detector 32 when the RF power amplifier 14 of the RF device 10A, 10B, 10C, generates a first power amplifier output power level, $V_{OUT1}$. The second measurement point, $MP_2$, may represent the power detector output voltage, $V_{DET2}$, generated by the non-linear power detector 32 when the power amplifier 14 of the RF device 10A, 10B, 10C, generates a second RF power amplifier output power level, $V_{OUT2}$. The third measurement point, $MP_3$, may represent the power detector output voltage, $V_{DET3}$, generated by the non-linear power detector 32 when the RF power amplifier 14 of the RF device 10A, 10B, 10C, generates a third power amplifier output power level, $V_{OUT3}$.

Figure 4:
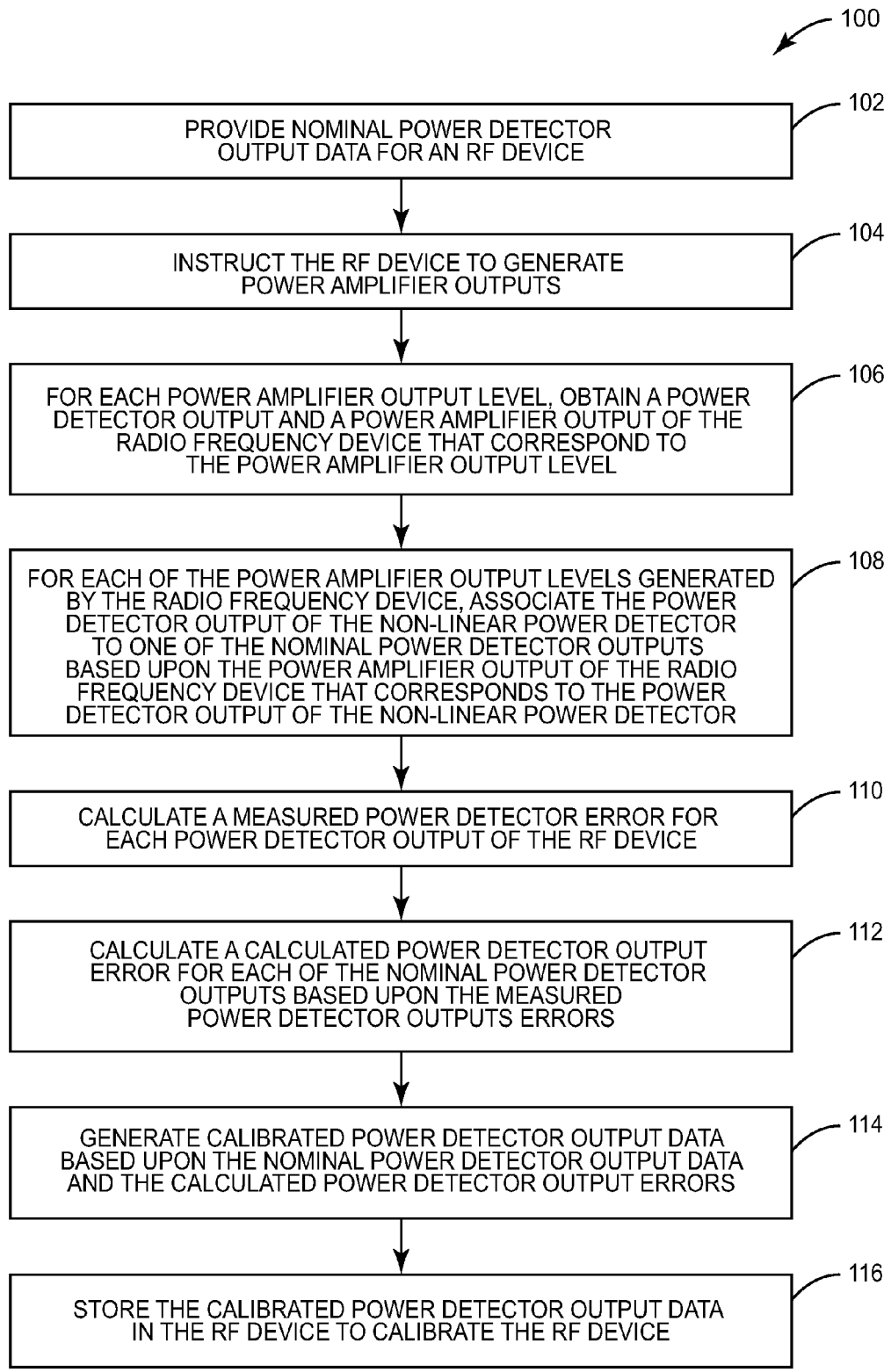
FIG. 4 depicts an example method for calibrating an RF device that uses a non-linear power detector to control the power output of an RF power amplifier.

FIG. 4 depicts an example method 100 for calibrating an RF device that uses a non-linear power detector to control the output power level of an RF power amplifier. Method 100 of FIG. 4 will be discussed with continuing reference to FIGS. 2A, 2B, and 3. A calibration system 40A, 40B, may provide nominal power detector output data for a non-linear power detector of an RF device 10A, 10B, 10C, (102). The nominal power detector output data may be stored in the calibration controller 42A, 42B, of the calibration system 40A, 40B. To begin calibrating the RF device 44A, 44B, the calibration controller 42A, 42B may instruct the RF device 44A, 44B, via the control interface 20 to generate various power amplifier output power levels, (104). For example, the calibration controller 42A, 42B, may instruct the RF device 44A, 44B, to generate an RF output, $RF_{OUT}$, at a first power amplifier output power level, $V_{OUT1}$, a second power amplifier output power level, $V_{OUT2}$, and a third power amplifier output power level, $V_{OUT3}$, as depicted in FIG. 3. The first power amplifier output power level, $V_{OUT1}$, may correspond to a low power level. The second power amplifier output power level, $V_{OUT2}$, may correspond to a medium power level. The third power amplifier output power level, $V_{OUT3}$, may correspond to a high power level. In some embodiments, the calibration controller 42A, 42B, may instruct the RF device 44A, 44B to generate an RF output, $RF_{OUT}$, at a lower power level and a high power level.

For each of the power amplifier output levels generated by the radio frequency device, the calibration controller 42A, 42B may obtain a power detector output voltage, $V_{DET}$, of the radio frequency device 44A, 44B, and a power amplifier output power level, $V_{OUT}$, for each power amplifier output level generated at the RF output, $RF_{OUT}$, of the RF device 44A, 44B, (106). For example, the calibration controller 42A may obtain the measured power detector output voltages, $V_{DET1}$, $V_{DET2}$, and $V_{DET3}$, (depicted in FIG. 3) from the voltmeter 48, where the measured power detector output voltages, $V_{DET1}$, $V_{DET2}$, and $V_{DET3}$, which correspond to the measured power amplifier output voltage levels, $V_{OUT1}$, $V_{OUT2}$, and $V_{OUT3}$, respectively. As another example, the calibration controller 42B may obtain the measured power detector output voltages, $V_{DET1}$, $V_{DET2}$, and $V_{DET3}$, from either the memory or the processor of the RF device 44B. In the case where the RF device 44A does not include an external pin or an analog-to-digital converter to provide the power detector output voltage, $V_{DET}$, the calibration controller 42A may use the value of digital $V_{RAMP}$ signal, $V_{RAMP\_D}$, used to generate the $V_{RAMP}$ signal as the measured power detector output voltages, $V_{DET1}$, $V_{DET2}$, and $V_{DET3}$, generated by the non-linear power detector of the RF device 44A. For example, the calibration controller 42A may provide a value of a target supply voltage for each of the plurality of power amplifier output levels to be generated by the power amplifier of the RF device. For example, referring to FIG. 1A, the target supply voltage may be the digital value of the digital $V_{RAMP}$ signal, $V_{RAMP\_D}$, that the processor 24 provides to the digital-to-analog converter 28 in order to generate a desired $V_{RAMP}$.

As another example, the calibration controller 42A, 42B, may obtain the power amplifier output level, $V_{OUT}$, for each power amplifier output level that the RF device, 44A, 44B, generates based upon the instructions from the calibration controller 42A, 42B, from the power meter 46. The power meter 46 may measure the power amplifier output level at the antenna port of the RF device 44A, 44B. Alternatively, the power meter 46 may measure the radiated power amplifier output level generated by the antenna of the RF device 44A, 44B.

The calibration controller 42A, 42B, may be configured to associate each measured power detector output voltage, $V_{DET1}$, $V_{DET2}$, and $V_{DET3}$, to one of the nominal power detector output voltages, $V_{NOM}$, of the nominal power detector output data based upon the respective measured power amplifier output voltage levels, $V_{OUT1}$, $V_{OUT2}$, and $V_{OUT3}$, that correspond to the measured power detector output voltage, $V_{DET1}$, $V_{DET2}$, and $V_{DET3}$, (108). For example, in the case where the measured power amplifier output voltage levels, $V_{OUT1}$, $V_{OUT2}$, and $V_{OUT3}$, provide greater resolution than the nominal power detector output data, the calibration controller 42A, 42B, may round the measured power amplifier output voltage levels, $V_{OUT1}$, $V_{OUT2}$, and $V_{OUT3}$, to have the same resolution as provided by the nominal power detector output data stored in the calibration controller 42A, 42B. After the rounding operation, the calibration controller 42A, 42B, matches each of the measured power amplifier output voltage, $V_{OUT1}$, $V_{OUT2}$, and $V_{OUT3}$, to a respective nominal power amplifier output level, $V_{OUT\_NOM1}$, $V_{OUT\_NOM2}$, and $V_{OUT\_NOM3}$, of the nominal power detector output data, as depicted in FIG. 3. As an example, depicted in FIG. 3, for the first measuring point, $MP_1$, $V_{OUT1}$ is matched to $V_{OUT\_NOM1}$. For the second measuring point, $MP_2$, $V_{OUT2}$ is matched to $V_{OUT\_NOM2}$. For the third measuring point, $MP_3$, $V_{OUT3}$ is matched to $V_{OUT\_NOM3}$. Thereafter, the measured power detector output voltages, $V_{DET1}$, $V_{DET2}$, and $V_{DET3}$, may then be compared to the nominal power detector output voltages, $V_{NOM1}$, $V_{NOM2}$, and $V_{NOM3}$, that correspond to the nominal power amplifier output power levels, $V_{OUT\_NOM1}$, $V_{OUT\_NOM2}$, and $V_{OUT\_NOM3}$, respectively.

A power detector output error, $\Delta(V_{OUT})$, for each of the measured power detector output voltages, $V_{DET1}$, $V_{DET2}$, and $V_{DET3}$, may then be calculated (110). For example, a first power detector output error, $\Delta 1$, is the difference between the first measured power detector output voltage, $V_{DET1}$, and the nominal power detector output voltage, $V_{NOM1}$. A second power detector output error, $\Delta 2$, is the difference between the second power detector output voltage, $V_{DET2}$, and the nominal power detector output voltage, $V_{NOM2}$. The third power detector output error, $\Delta 3$, is the difference between the first power detector output voltage, $V_{DET3}$, and the nominal power detector output voltage, $V_{NOM3}$.

Thereafter, a power detector error, $\Delta(V_{OUT})$, for each of the nominal power detector output voltages contained in the nominal power detector output data may be calculated based on the measured power detector errors, $\Delta 1$, $\Delta 2$, $\Delta 3$, (112). As an example, a power detector output error function, $F(V_{OUT})$, for the RF device 44A, 44B being calibrated may be determined based upon the power detector output errors, $\Delta 1$, $\Delta 2$, $\Delta 3$, and the nominal power amplifier output levels, $V_{OUT\_NOM1}$, $V_{OUT\_NOM2}$, $V_{OUT\_NOM3}$, associated with the power detector output errors, $\Delta 1$, $\Delta 2$, $\Delta 3$. The power detector output error function, $F(V_{OUT})$, may be a piece-wise linear function. As an example, the power detector output function, $F(V_{OUT})$, may characterize the power detector output errors based upon a set of linear functions, $F_1(V_{OUT})$ and $F_1(V_{OUT})$, depicted in FIG. 3, where $$F_1(V_{OUT})=[(\Delta 2-\Delta 1)/(V_{OUT\_NOM2}-V_{OUT\_NOM1})]^* (V_{OUT}-V_{OUT\_NOM1})+\Delta 1, \text{ for } V_{out} \leq V_{OUT\_NOM2},$$

and $$F_2(V_{OUT})=[(\Delta 3-\Delta 2)/(V_{OUT\_NOM3}-V_{OUT\_NOM2})]^* (V_{OUT}-V_{OUT\_NOM2})+\Delta 2, V_{out}>V_{OUT\_NOM2}.$$

In some embodiments, the power detector output error function, $F(V_{OUT})$, may be a line based upon only two measured data points. As an example, in the case where the calibration controller 42A, 42B, only instructs the RF device 44A, 44B to generate an RF output, $RF_{OUT}$, at a lower power level and a high power level, power detector output error function, $F(V_{OUT})$, may be a linear function $F(V_{OUT})'$ as follows:

$$F(V_{OUT})'=[(\Delta 3-\Delta 1)/(V_{OUT\_NOM3}-V_{OUT\_NOM1})]^* (V_{OUT}-V_{OUT\_NOM1})+\Delta 1.$$

Using the calculated power detector errors provided by the power detector output function, and the measured power detector errors, $\Delta 1$, $\Delta 2$, $\Delta 3$, the calibration controller 42A, 42B, may generate a calibrated power detector output data for the RF device, 44A, 44B, being calibrated, (114). The calibrated power detector output data may be generated by shifting the nominal power detector output voltages, $V_{NOM}(V_{OUT})$, stored in the nominal power detector output data by an amount equal to the calculated power detector errors. The calibrated power detector output voltages, $V_{DET\_CAL}(V_{OUT})$, may be calculated as follows:

$$V_{DEL\_CAL}(V_{OUT})=V_{NOM}(V_{OUT})+F_1(V_{OUT}), \text{ for } V_{OUT} \leq V_{OUT\_NOM2},$$

and $$V_{DET\_CAL}(V_{OUT})=V_{NOM}(V_{OUT})+F_2(V_{OUT}), V_{OUT}>V_{OUT\_NOM2}, \text{ and}$$

where $V_{NOM}(V_{OUT})$ represents the nominal power detector output voltages for each nominal output power level specified in the nominal power detector output data.

In some embodiments of method 100, for example where the calibration controller 42A, 42B, only instructs the RF device 44A, 44B to generate an RF output, $RF_{OUT}$, at a lower power level and a high power level, the calculated power detector output voltage, $V_{DEL\_CAL}(V_{OUT})'$, may be calculated as follows:

$$V_{DET\_CAL}(V_{OUT}) = V_{NOM}(V_{OUT}) + F(V_{OUT})'.$$

The calibration controller 42A, 42B, stores the calibrated power detector output data in the memory of RF device 44A, 44B, to calibrate the RF device, 44A, 44B, (116). For example, referring to FIGS. 1A, 1B, and 1C, the calibrated power detector output data may be stored in the memory 26 associated with the processor 24 via the control interface 20. Similar to the nominal power detector output data stored in the calibration controller 42A, 42B, the calibrated power detector output data may include a calculated power detector output voltage, $V_{DET\_CAL}$, and an associated nominal power amplifier output, $V_{OUT\_NOM}$, for each of the nominal power detector outputs, $V_{NOM}$, contained in the nominal power detector output data.

Figure 5:
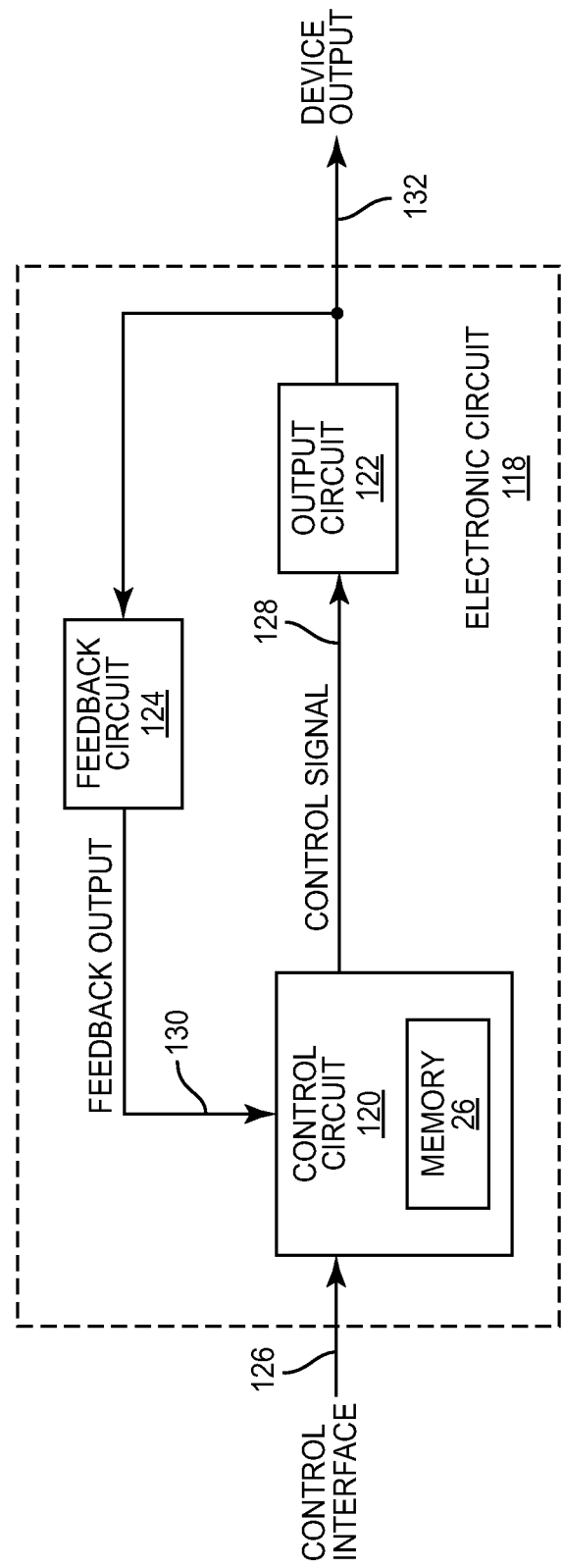
FIG. 5 depicts an embodiment of an example electronic device.

FIG. 5 depicts an example embodiment of an electronic circuit 118 having a control circuit 120, an output circuit 122, and a feedback circuit 124. In some embodiments, the feedback circuit 124 may be a non-linear feedback circuit. The control circuit 120 may be configured to couple to a control interface 126 by which a calibration system (not shown) may control the electronic circuit 118. The control circuit 120 may include a memory 26 in which calibrated response curve data of the feedback circuit 124 may be stored. The control circuit 120 may include a process or processor control logic, discrete or integrated control logic, registers, analog controllers, analog amplifiers, integrators, and/or other circuitry that would normally be present in a control circuit 120 of an electronic circuit known in the art.

The control circuit 120 may provide a control signal 128 to the output circuit 122. The control circuit 120 may receive a feedback output 130 from the feedback circuit 124. The control signal 128 provided by the control circuit 120 may be based, at least in part, on the feedback output 130 provided by the feedback circuit 124.

The output circuit 122 may be configured to provide an output voltage and/or current to the device output 132 of the electronic circuit 118 based at least in part on the control signal 126 received from the output circuit 122. The feedback circuit 124 may be in communication with the output circuit 122 and configured to receive an indication of the device output 132 of the electronic circuit 118 generated by the output circuit 122. The indication of the device output 132 of the electronic circuit 118 may be a voltage or a current. The indication of the device output 132 of the electronic circuit 118 may provide an indication of a power level delivered by the output circuit 122 to a load (not shown). The indication of the device output 132 of the electronic circuit 118 may be either directly or indirectly obtained from the indication of the device output 132 of the electronic circuit 118. For example, the indication of the device output of the electronic circuit 118 may be generated by a current mirror or a coupler in order to sense a current output generated by the output circuit 112.

The feedback circuit 124 generates a feedback output 130 based upon the indication of the device output 132 of the electronic circuit 118. The nominal relationship between the indication of the device output 132 of the electronic circuit 118 and the feedback output 130 generated by the feedback circuit 124 may be characterized by nominal response curve data. The nominal response curve data may include a set of data points that characterize the nominal or expected behavior of a nominal feedback circuit 124. For example, the nominal response curve data may include a nominal feedback output associated with a nominal indication of the device output 132 of the electronic circuit 118 for each data point in the set of data points that makes up the nominal response curve data. The nominal response curve data may be used by a calibration system (not shown) to generate a calibrated response curve data for each electronic circuit 118 built by in a factory. At calibration time, the calibrated response curve data may be stored in the memory of the control circuit 120 to calibrate the electronic circuit 118. During normal operation of the electronic circuit 118, the control circuit 120 may use the calibrated response curve data to generate the control signal provided to the output circuit 122.

The calibration system (not shown) for calibrating the electronic circuit 118 may include a computer or processor and measurement devices for measuring the device output of the electronic circuit 118. The calibration system (not shown) for the electronic circuit 118 may store the nominal response curve data for the electronic circuit 118 in a memory associated with the computer or processor of the calibration system (not shown).

Figure 6:
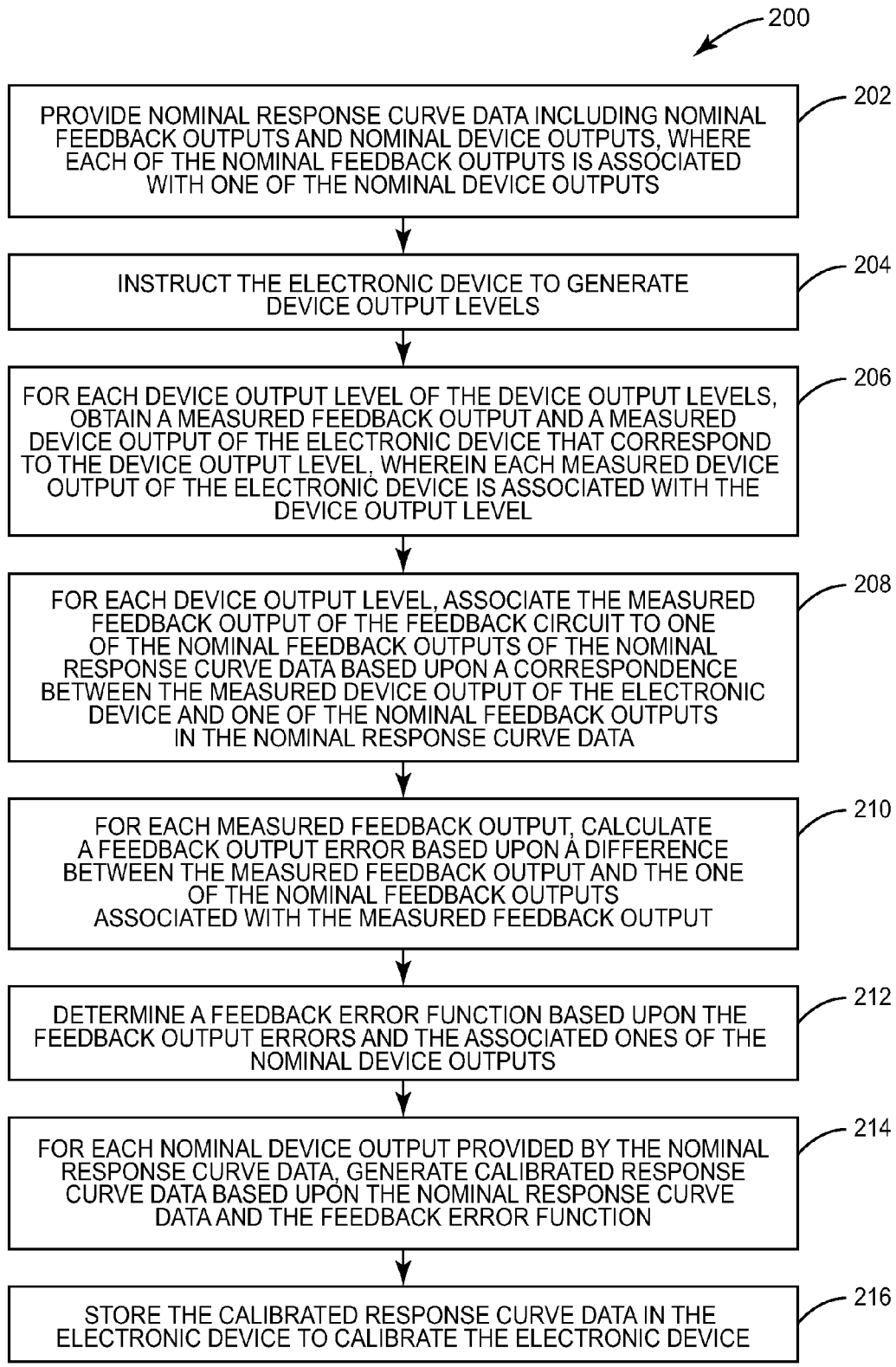
FIG. 6 depicts an example method for calibrating an electronic device that is based upon a response of the electronic device under test and a nominal response curve data set.

FIG. 6 depicts an example method 200 for calibrating an electronic device 188 that is based upon a response of the electronic circuit 118 under test and a nominal response curve data stored in the calibration system (not shown). The nominal response curve data may be for a non-linear feedback circuit. The example method 200 is described below with continuing reference to the electronic circuit 118 of FIG. 5.

The nominal response curve data for the calibration system (not shown) of the electronic circuit 118 may be provided to the calibration system (not shown), (202), and stored in the calibration system. The nominal response curve data may include nominal feedback outputs and nominal device outputs, where each of the nominal feedback outputs is associated with one of the nominal device outputs.

The calibration system (not shown) may instruct the electronic circuit 118 to generate several device output levels of interest during the calibration process. (204). The several device output levels may reflect low, medium, and high output levels generated by the output circuit 122 of the electronic circuit 118.

For each device output level generated by the electronic circuit 118, the calibration system may obtain a measured feedback output of the feedback circuit 124 and a measured device output of the electronic circuit 118, (206). The measured feedback output of the feedback circuit 124 may be either directly measured by the calibration system or obtained from the control circuit 120 via the control interface of the control circuit 120. Each measured feedback output of the feedback circuit 124 and measured device output corresponds to one of the several device output levels generated by the electronic circuit 118. In addition, each measured device output of the electronic circuit 118 may be associated with one of the several device output levels.

For each device output level, the calibration system associates the measured feedback output of the feedback circuit 124 to one of the nominal feedback outputs of the nominal response curve data based upon a correspondence between the measured device output of the electronic circuit 118 and one of the nominal feedback outputs of the nominal response curve data, (208). For example, to determine the correspondence between the measured device output of the electronic circuit 118 and one of the nominal feedback outputs of the nominal response curve data, the calibration system matches each measured device output to one of the nominal device outputs in the nominal response curve data.

For each measured feedback output, the calibration system (not shown) calculates a feedback output error based upon a difference between the measured feedback output and the one of the nominal feedback outputs stored in the nominal response curve data that is associated with the measured feedback output, (210). Each feedback output error may be associated with the one of the nominal device outputs based upon the association of each nominal feedback output to a nominal device output in the set of data points of the nominal response curve data.

The calibration system (not shown) for the electronic circuit 118 may determine a feedback error function for the feedback circuit 124 based upon the feedback output errors calculated by the calibration system (not shown) and the associated ones of the nominal device outputs of the nominal response curve data, (212). In some embodiment of the electronic circuit 118, the feedback error function may be a linear function. In other embodiment of the electronic circuit 118, a piecewise-linear function may be used as the feedback error function.

For each nominal device output provided by the nominal response curve data, the calibration system (not shown) may generate calibrated response curve data based upon the nominal response curve data and the feedback error function, (214). The calibrated response curve data may include a calibrated feedback output and an associated nominal device output for each nominal device output of the nominal response curve data. For example, to generate one of the calibrated feedback outputs of the calibrated response curve data, the calibration system may add the output of the feedback error function to the nominal feedback output for a nominal device output level of the nominal response curve data.

The calibration system (not shown) for the electronic circuit 118 stores the calibrated response curve data in the electronic circuit 118 to calibrate the electronic circuit 118, (216). The calibrated response curve data may be stored in the memory of the electronic circuit 118.

Yet another embodiment of the present disclosure provides a method of power amplifier (PA) calibration for an envelope tracking system. The envelope tracking system is configured to improve the efficiency of a PA that operates in third generation (3G) and fourth generation (4G) modes. In these modes of operation, the peak to average ratio (PAR) of a radio frequency (RF) signal output from the PA can become relatively large. For example, in high speed data modes, the PAR is typically around 6 to 8 dB, but in some cases can be a few dB higher.

In order to minimize distortion, the peak power of the RF signal must be at or near the saturated power of the PA. This means that the average power of the RF signal is significantly less than the peak power and thus the efficiency of the PA is degraded as compared to operation with signals in which the PAR is much lower.

Figure 7:
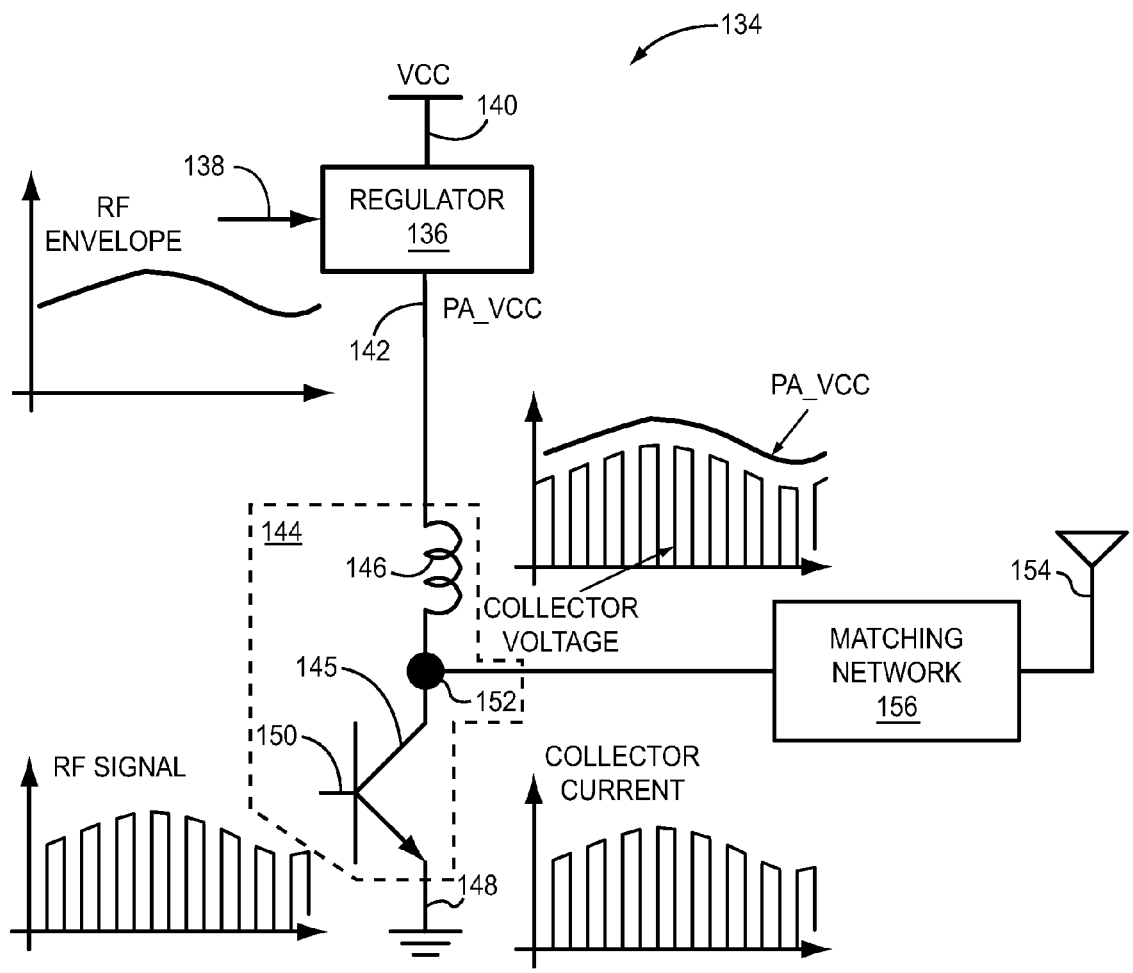
FIG. 7 depicts an exemplary embodiment of a related art envelope tracking system.

FIG. 7 depicts an exemplary embodiment of a related art envelope tracking system 134. A switching regulator 136 includes a modulation envelope input 138, a supply voltage input 140, and a supply voltage modulation output 142. A PA 144 includes an RF transistor 145 that is coupled to the supply voltage modulation output 142 through an inductive filter 146 that prevents an RF input signal from being shunted to ground through the switching regulator 136 and Vcc. The PA 144 also includes an RF input 150 that receives the RF input signal and an output 152 that outputs an amplified copy of the RF input signal. An antenna 154 is coupled to the output 152 through an impedance matching network 156.

In operation of the related art envelope tracking system 134, an RF envelope signal that is in synchronization with the RF input signal is applied to the modulation envelope input 138. In response, the switching regulator outputs a modulated supply voltage PA_Vcc that has the same shape or substantially the same shape as the RF envelope signal. As a result, the modulated supply voltage PA_Vcc will relatively closely track the output voltage, which in this exemplary case is a collector voltage. As such, the saturated power of the PA 144 will vary with the RF envelope signal that is used as an envelope tracking signal. Thus, the PA 144 will typically remain efficient despite high PAR values.

The related art envelope tracking system 134 may be considered an idealized envelope tracking system in that the RF envelope is ideally exactly the same shape as the RF signal. However, the related art envelope tracking system 134 is not ideal in a practical sense because the gain of the PA 144 will change as the supply voltage PA_Vcc is modulated and thus the output voltage will be distorted.

Figure 8:
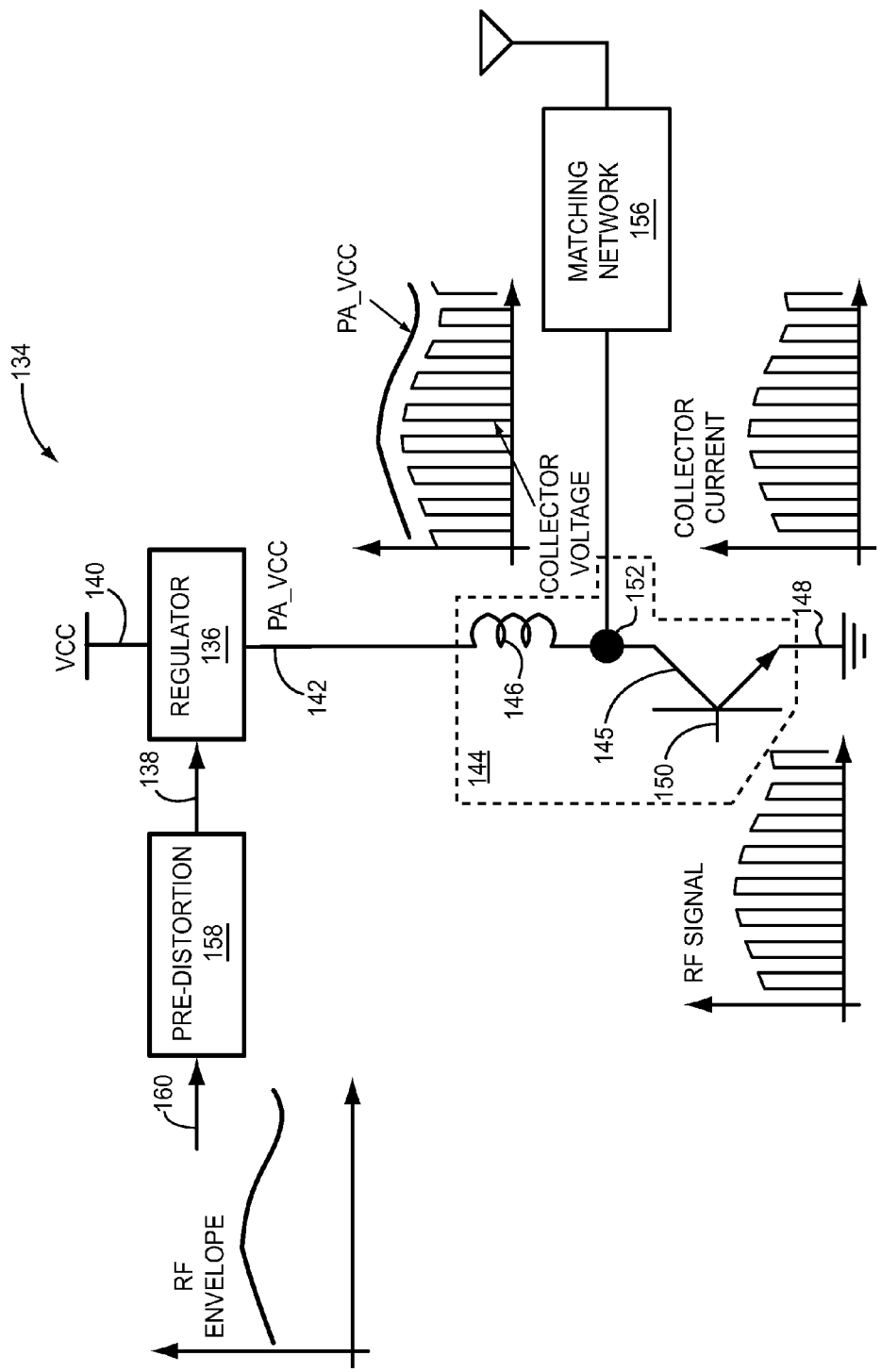
FIG. 8 depicts an exemplary embodiment of a related art envelope tracking system that is modified to include pre-distortion.

FIG. 8 depicts an exemplary embodiment of the related art envelope tracking system 134 that is modified to include a pre-distortion circuit 158 that minimizes distortion of the output voltage due to the varying gain of the PA 144. The pre-distortion circuit 158 has an RF envelope input 160 that receives an RF envelope. The pre-distortion circuit outputs a pre-distorted version of the RF envelope to the switching regulator 136 via the modulation envelope input 138. In order for the related art envelope tracking system 134 to operate properly, the gain of the PA 144 must be accurately defined as a function of the supply voltage PA_Vcc versus the RF input power driving the RF input 150 of the PA 144. The amount of pre-distortion applied to the RF signal by the pre-distortion circuit 158 is selected to urge the PA 144 to operate on a curve of constant gain (iso-gain).

Figure 9:
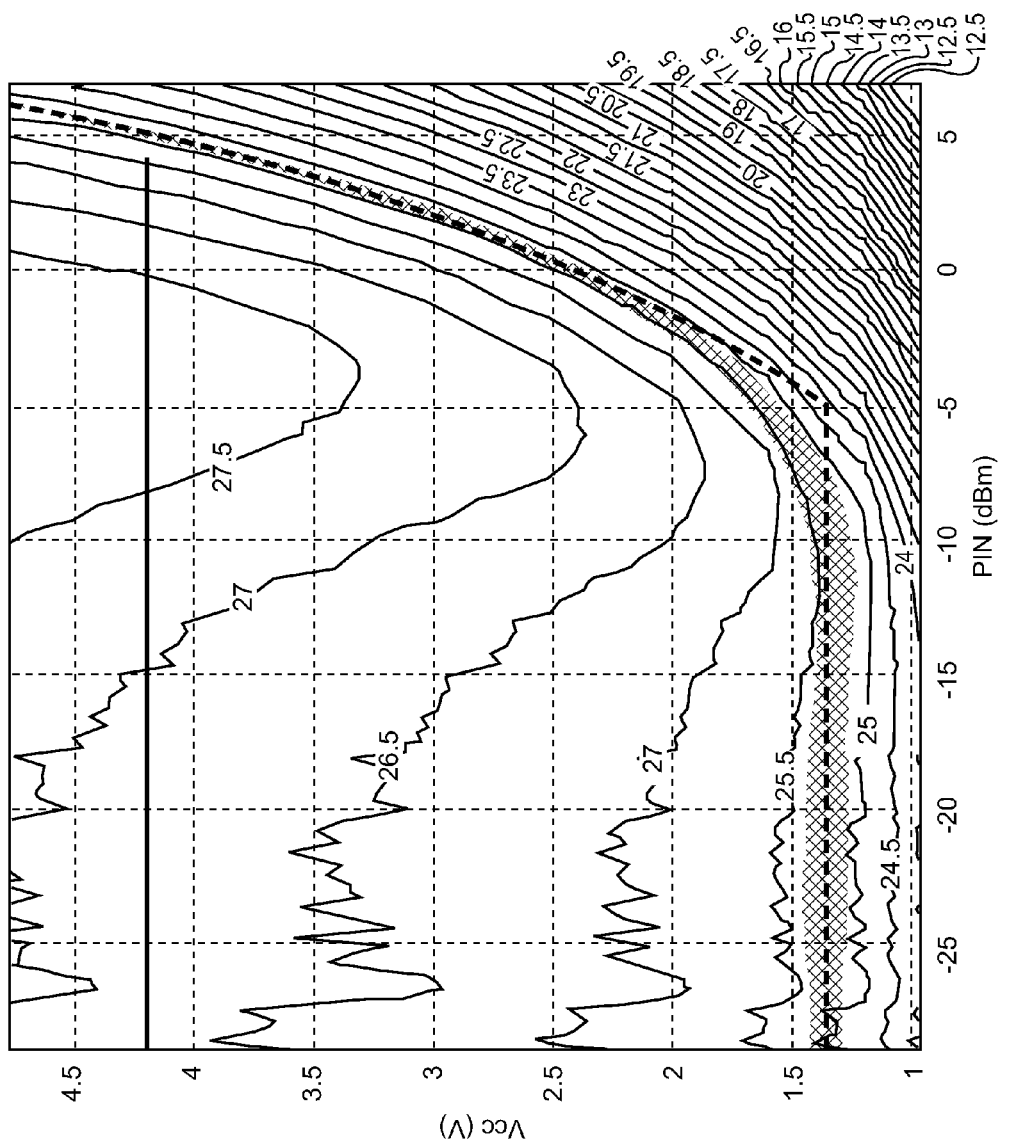
FIG. 9 is a graph that includes a plot of curves of constant gain for a nominal power amplifier (PA).

Before an RF device incorporating the PA 144 is shipped from an RF device factory, the PA 144 of the related art envelope tracking system 134 must be calibrated so that constant gain can be maintained for all values of supply voltage Vcc and input power Pin. FIG. 9 is a graph that includes a plot of curves of constant gain for a nominal PA (not shown). However, the PA 144 will exhibit curves of constant gain that will not exactly match the curves of constant gain for the nominal PA. As a result, an iterative calibration method is proposed to calibrate the PA 144 of the related art envelope tracking system 134.

Returning to FIG. 2B, the iterative calibration method may start with an entry into the calibration controller 42B of a set point for a low value of Pin (e.g., −25 dBm). An upper value of supply voltage Vcc is then set so that a resultant gain is likely well above a desired gain. The resultant gain is then measured and recorded. Next, a lower value of supply voltage Vcc is set so that another resultant gain is likely well below the desired gain. This other resultant gain is then measured and recorded. A new value of supply voltage Vcc is determined from the upper and lower values of supply voltage Vcc. The new value of the supply voltage and the resultant gain is measured. If the resultant gain from the new value of supply voltage Vcc does not result in the desired gain, the above steps are repeated until the desired gain is realized. As the above steps are repeated, the upper and lower values of supply voltage Vcc will converge. Once the convergence occurs, the Pin may be incremented while the output power is measured and recorded until a maximum output power is reached. Problematically, the above iterative calibration method will likely require a large number of iterative measurements that would need to be repeated at several frequencies across every band of operation. Therefore, the above described iterative calibration method is less desirable for an RF device incorporating the related art envelope tracking system 134.

Figure 10:
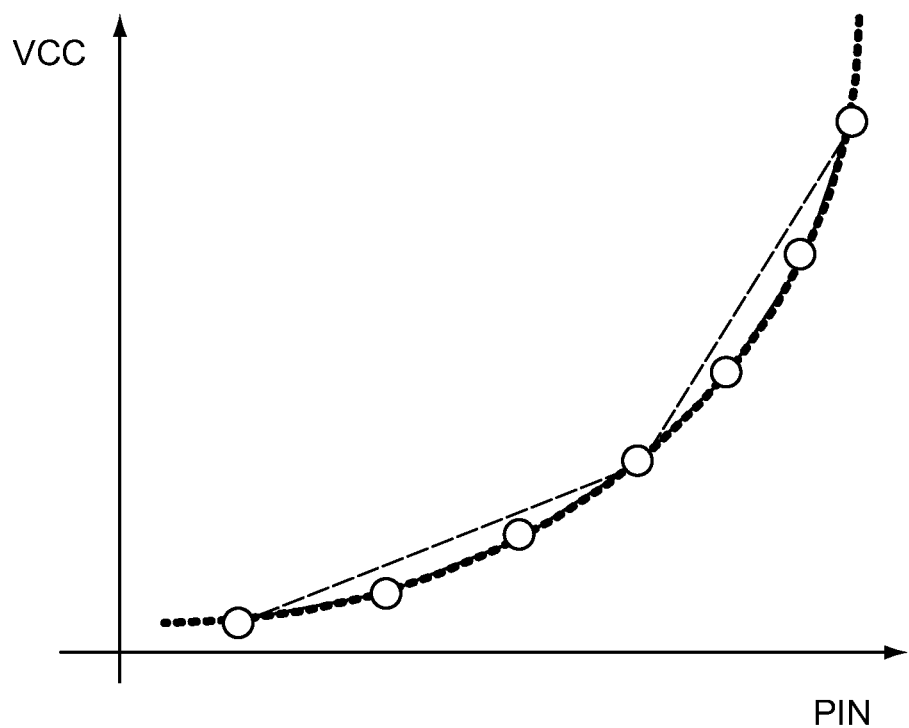
FIG. 10 is a graph of input power Pin versus supply voltage Vcc that includes a related art example of linear calibration.

FIG. 10 is a graph of input power Pin versus supply voltage Vcc that includes a related art example of linear calibration. Consider the non-linear curve plotted in dashed line in the graph of FIG. 10. Several points represented by hollow dots are measured. Then a relatively rough approximation of the non-linear curve can be formed if these points are connected using line segments represented by thick lines. An accurate calibration of the PA 144 can be achieved using relatively few measurement points if the non-linear curve is close to being linear. However, as the non-linearity of the non-linear curve increases, the number of measurement points also increases if the same calibration accuracy is to be met. As shown in FIG. 9, the curves of constant gain for the nominal PA are relatively highly non-linear. Therefore, a relatively large number of measurement points would be needed to accurately calibrate the PA 144.

Returning to the exemplary graph of FIG. 10, six measurement points result in an acceptable approximation of the non-linear curve, whereas taking only three measurement points results in an unacceptable error. Therefore, this calibration method described for FIG. 10 can become prohibitively costly since it relies upon the iterative calibration method to find each measurement point.

Remaining with FIG. 10, splines depicted by two thin lines are sometimes used to represent a non-linear function. However, splines typically cannot adequately represent the non-linear behavior between measurements points. As such, the use of splines for calibrating the PA 144 can produce unacceptable errors.

As a result of the deficiencies discovered in the PA calibration methods described above, superior methods for calibrating the PA 144 are presented in the following descriptions that are in accordance with the present disclosure. In particular, the present disclosure provides methods in which relatively few points are measured using the calibration system 40B (FIG. 2B).

Figure 11:
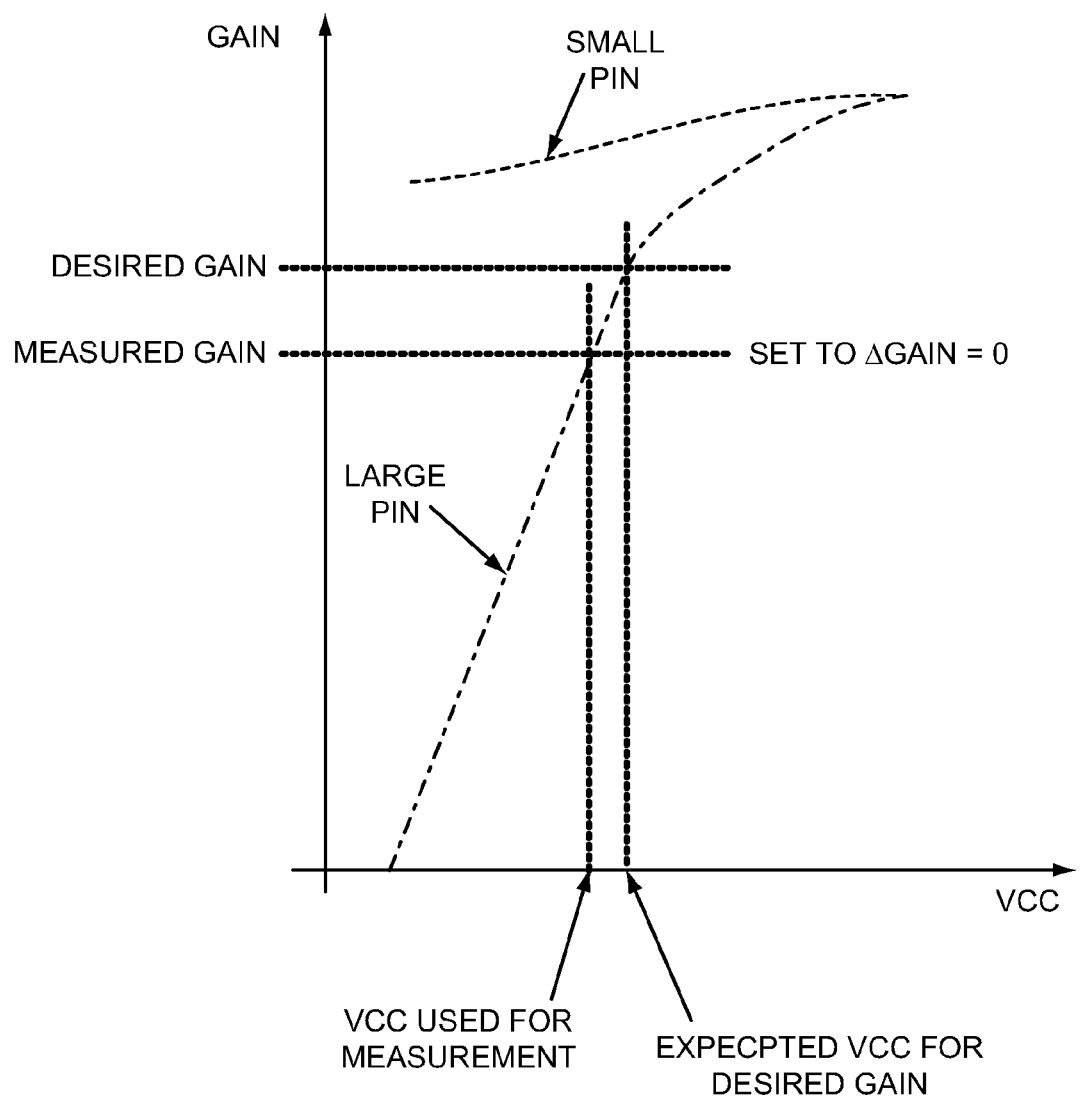
FIG. 11 is a graph of supply voltage Vcc versus GAIN that includes an example of Vcc shift estimation according to the present disclosure.

In this regard, a technique for Vcc shift estimation is disclosed to eliminate the need for an iterative process of determining the supply voltage Vcc needed for each input power Pin. FIG. 11 is a graph of supply voltage Vcc versus GAIN that includes an example of Vcc shift estimation according to the present disclosure. The graph of supply voltage Vcc versus Gain is constructed from the plot of curves of constant gain for a nominal power amplifier (PA) (FIG. 9). For example, a value of Vcc and a value of gain are read for each Pin. The FIG. 11 graph of supply Vcc versus gain depicts a gain curve for a small Pin and a gain curve for a large Pin. The values of supply voltage Vcc versus gain for each Pin collected from the graph of supply voltage Vcc versus gain are stored in memory associated with the calibration system 40B.

Figure 12:
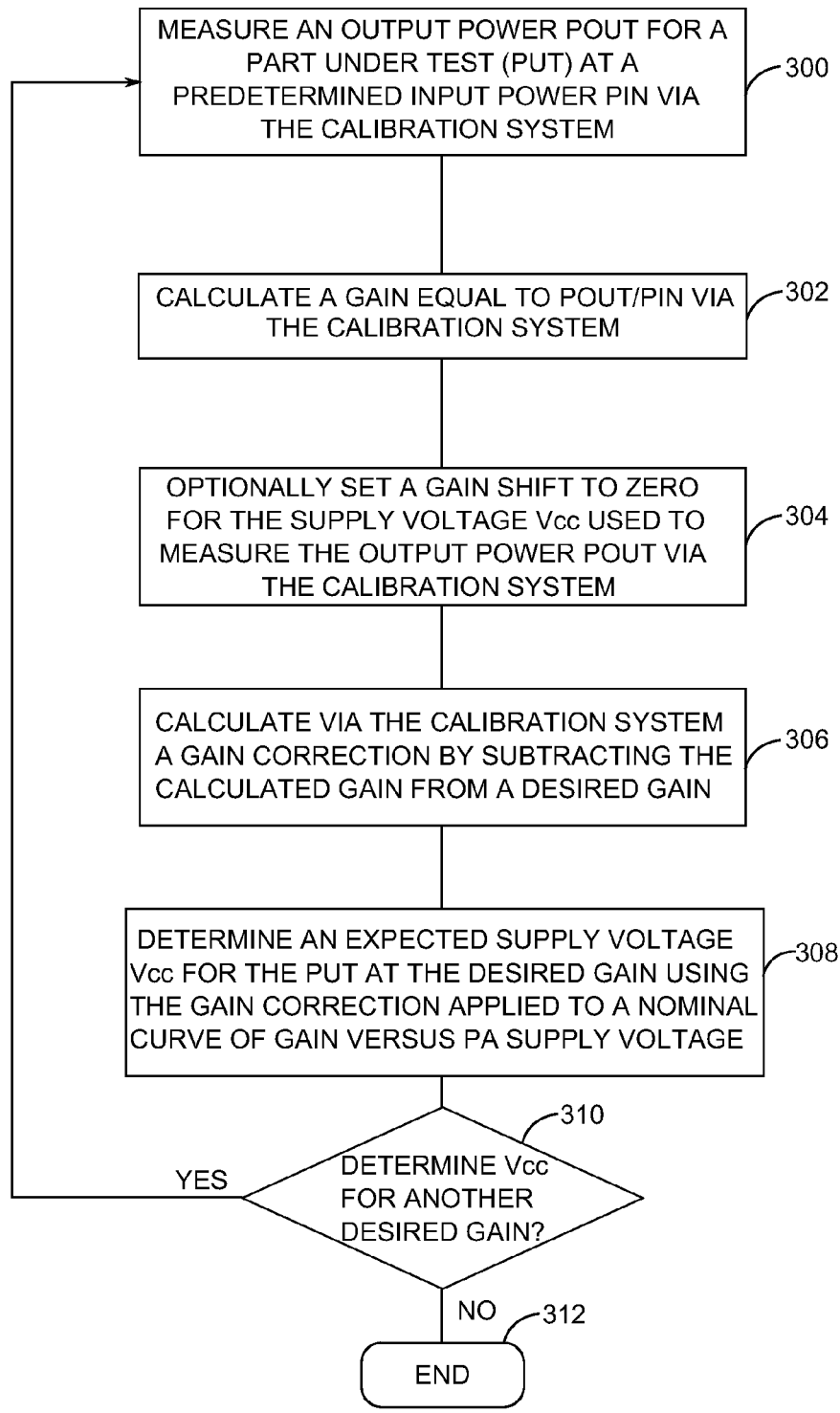
FIG. 12 depicts an example method for estimating an amount of supply voltage shift needed to determine a supply voltage Vcc for a given power input Pin.

FIG. 12 depicts an exemplary method for estimating an amount of supply voltage shift needed to determine a supply voltage Vcc for a given power input Pin. The calibration system 40B is programmable to perform the method steps depicted in FIG. 12. The method may begin by measuring an output power POUT for a predetermined input power PIN via the calibration system 40B (step 300). The measured POUT is then useable by the calibration system 40B to calculate a gain equal to POUT/PIN (step 302). The calibration system 40B may then perform an optional step that sets a gain shift to zero for the supply voltage Vcc used to measure the output power POUT (step 304). The calibration system 40B then calculates a gain correction by subtracting the calculated gain from a desired gain (step 306). The calibration system 40B then determines an expected supply voltage Vcc for the desired gain using the gain correction applied to a nominal curve of gain versus PA supply voltage (step 308). If another supply voltage Vcc for another desired gain is required the steps 300 through 308 are repeated. If not, the method for estimating the amount of supply voltage shift is ended (step 312). A typical number of determinations of supply voltage Vcc is three with one for a relatively low Pin, a second for a medium Pin, and a third for a relatively high Pin. In this manner, a calibration for an entire range of PA operation is covered.

Figure 13:
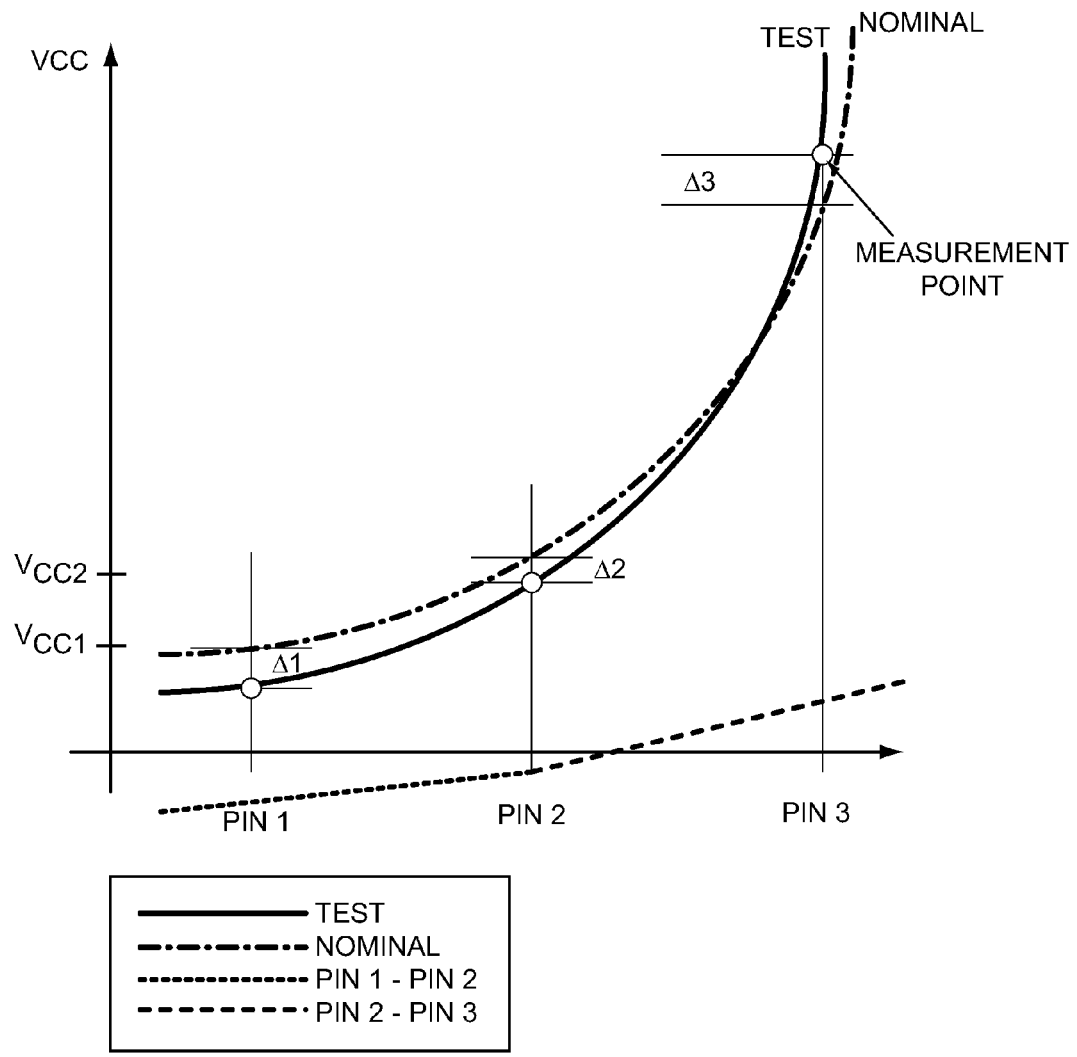
FIG. 13 is a graph of input power Pin versus supply voltage Vcc that includes an example of calibration and nominal curves.

FIG. 13 is a graph of input power Pin versus supply voltage Vcc that includes an example of calibration and nominal curves for a PA that is usable in an envelope tracking system. The dotted and dashed curve represents the shape of a nominal PA gain curve that is stored as an array of values in the calibration system 40B. The solid curve represents the PA gain curve of a test part also known as a part under test (PUT).

In accordance with the present disclosure a calibration method for a PA included in an envelope tracking system is based upon a notion that the nominal PA curve contains all of the curve shape information needed to describe the PA gain of the PUT. Moreover, only a relatively few measured points, typically three but as few as two may be used to determine deviations of the PA gain of the PUT from the nominal PA curve. Three measured points denoted by dots along the PA gain curve of the PUT are depicted in FIG. 13. A difference at each of the measurement points is calculated between the PA gain of the PUT and the nominal PA curve. Preferably, a first difference delta 1 is determined at a low range of supply voltage and a first input power Pin 1, a second difference delta 2 is determined at a mid-range of supply voltage and a second input power Pin 2, and a third difference delta 3 is determined at an upper range of supply voltage at a third input power Pin 3.

Based on the differences delta 1, delta 2, and delta 3, slopes and intercepts for two lines are calculated to determine the calibration errors between the PA gain curve of the PUT and the nominal PA gain curve. The first line (Pin 1-Pin 2) is depicted with short dashes between the first input power Pin 1 and the second input power Pin 2. The second line (Pin 2-Pin3) is depicted with long dashes between the second input power Pin 2 and the third input power Pin 3. Calibration values calculated from these two lines representing a first calibration shift 1 and a second calibration shift 2 are stored in a memory of a wireless device that includes the PUT. The calibration values are typically stored as a look up table of supply voltage Vcc versus input power Pin. A first constant Vcc1 is taken from the nominal calibration curve at the first power input Pin1, while a second constant Vcc2 is taken from the nominal calibration curve at the second power input Pin2. Supply voltage levels for Vcc are interpolated and extrapolated over the desired operating range of the PUT. The calibration values are calculated using the following relationships.

Calibration shift $1=[(\Delta 2-\Delta 1)/(Pin2-Pin1)]*(Vcc-Vcc1)+\Delta 1$ (use for Pin<Pin2)

Calibration shift $2=[(\Delta 3-\Delta 2)/(Pin3-Pin2)]*(Vcc-Vcc2)+\Delta 2$ (use for Pin>Pin2)

Figure 14:
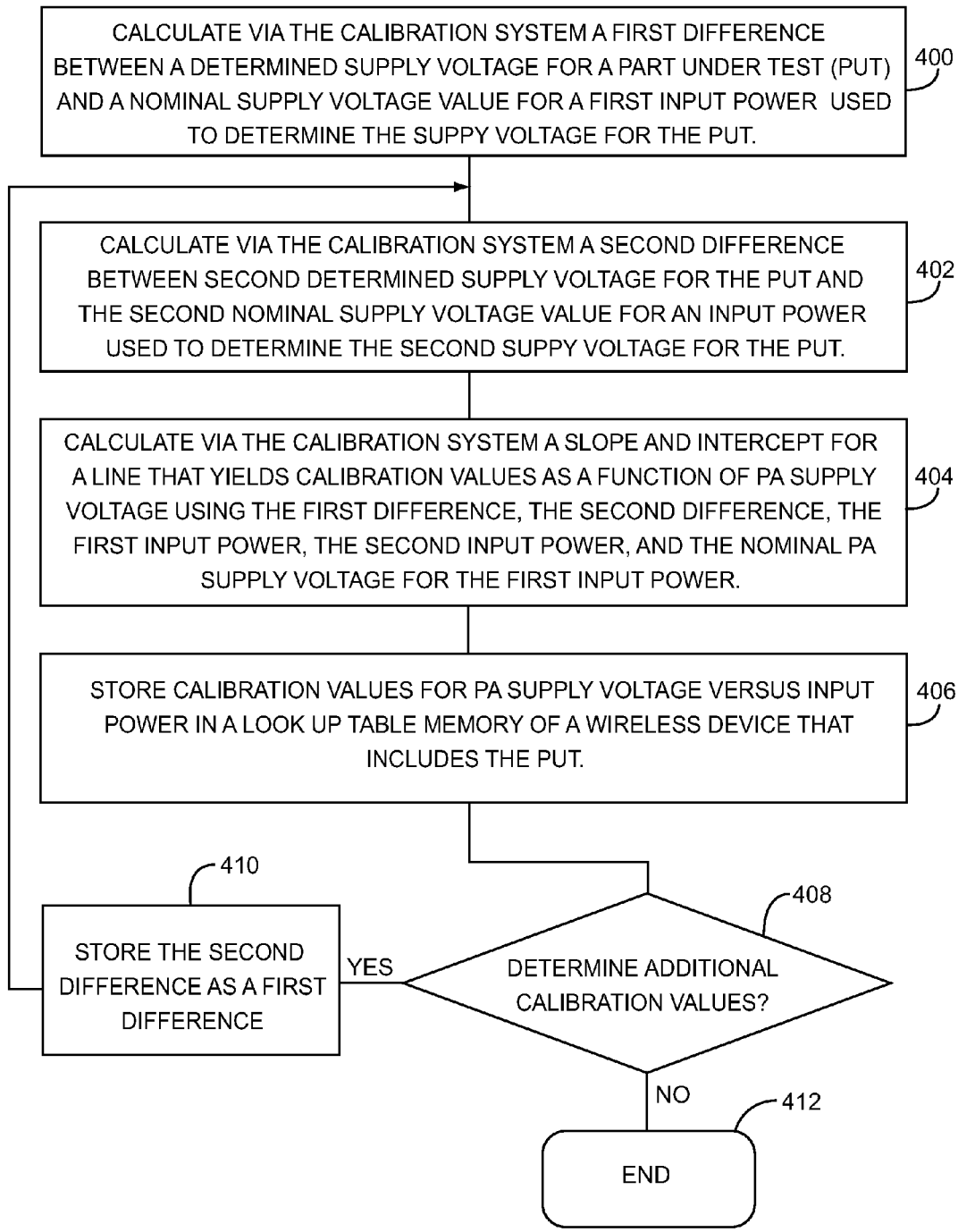
FIG. 14 depicts an example method for calibrating a PA of an envelope tracking system.

FIG. 14 depicts the above described method for calibrating a PA of an envelope tracking system. The method begins by calculating a first difference between a supply voltage determined using the method depicted in FIG. 12 for a part under test (PUT) and a nominal supply voltage value for a first input power used to determine the supply voltage for the PUT (step 400). Next, a second difference between the second determined supply voltage for the PUT and a second nominal supply voltage value for an input power used to determine the second supply voltage for the PUT (step 402). The calibration system 40B then calculates a slope and intercept for a line that yields calibration values as a function of PA supply voltage using the first difference, the second difference, the first input power, the second input power, and the nominal PA supply voltage for the first input power (step 404). The calibration system then writes the calibration values for the PA supply voltage versus input power to a look up table memory of a wireless device that includes the PUT (step 408). The calibration system 40B then determines if additional calibration values are needed (step 408). If yes, the calibration system 40B stores the second difference as a first difference and steps 402 through 408 are repeated. Note that on this second pass the second difference will be the third difference Δ3 that is shown in FIG. 13. If no additional calibration values are needed, the calibration method is ended (step 412).

After calibration and during normal operation, a wireless device that includes the PUT adds the calibration values to nominal values of the nominal PA curve that are also stored in a memory of the wireless device. When the calibration values are added to the nominal values, an accurate PA gain curve for the operation of the wireless device will be realized.

Those skilled in the art will recognize improvements and modifications to the embodiments of the present disclosure. All such improvements and modifications are considered within the scope of the concepts disclosed herein and the claims that follow.

What is claimed is:

1. A method for power amplifier (PA) calibration for an envelope tracking system of a wireless device comprising:
   measuring an output power of a PA that is a part under test (PUT) at a predetermined input power;
   calculating a gain equal to the output power of the PA divided by the predetermined input power;
   calculating a gain correction by subtracting the calculated gain from a desired gain;
   determining an expected supply voltage for the PA at the desired gain using the gain correction applied to a nominal curve of gain versus PA supply voltage;
   determining a first difference between a measured PA supply voltage and a nominal PA supply voltage value for a first input power;
   determining a second difference between a measured PA supply voltage and a nominal PA supply voltage value for a second input power;
   calculating a slope and an intercept for a line that that yields calibration values as a function of PA supply voltage using the first difference, the second difference, the first input power, and the second input power; and
   storing the calibration values for PA supply voltage versus input power in a look up table memory that is accessible by the wireless device.

2. The method of claim 1 further including steps comprising:
   determining a third difference between a measured PA supply voltage and a nominal PA supply voltage value for a third input power;
   calculating a second slope and a second intercept for a second line that that yields calibration values as a function of PA supply voltage using the second difference, the third difference, the second input power, and the third input power; and
   storing the calibration values for PA supply voltage versus input power in a look up table memory that is accessible by the wireless device.

3. The method of claim 1 wherein calculating the slope is performed by a calibration system having a processor that divides the second difference minus the first difference by the second input power minus the first input power.

4. The method of claim 1 wherein the intercept is equal to the first difference.

5. The method of claim 2 wherein calculating the second slope is performed by a calibration system having a processor that divides the third difference minus the second difference by the third input power minus the second input power.

6. The method of claim 2 wherein the intercept is equal to the second difference.

7. A calibration system for calibrating a PA for an envelope tracking system of a wireless device comprising:
   a memory to store an expected supply voltage of the PA;
   a processor programmed to:
      measure an output power of a PA that is a part under test (PUT) at a predetermined input power;
      calculate a gain equal to the output power of the PA divided by the predetermined input power;
      calculate a gain correction by subtracting the calculated gain from a desired gain; and
      determine an expected supply voltage for the PA at the desired gain using the gain correction applied to a nominal curve of gain versus PA supply voltage;
      determine a first difference between a measured PA supply voltage and a nominal PA supply voltage value for a first input power;
      determine a second difference between a measured PA supply voltage and a nominal PA supply voltage value for a second input power;
      calculate a slope and an intercept for a line that that yields calibration values as a function of PA supply voltage using the first difference, the second difference, the first input power, and the second input power; and
      store the calibration values for PA supply voltage versus input power in a look up table memory that is accessible by the wireless device.

8. The calibration system of claim 7 wherein the processor of the calibration system is further programmed to:
   determine a third difference between a measured PA supply voltage and a nominal PA supply voltage value for a third input power;
   calculate a second slope and a second intercept for a second line that that yields calibration values as a function of PA supply voltage using the second difference, the third difference, the second input power, and the third input power; and
   store the calibration values for PA supply voltage versus input power in a look up table memory that is accessible by the wireless device.

9. The calibration system of claim 7 wherein calculating the slope is performed by the processor that is programmed to divide the second difference minus the first difference by the second input power minus the first input power.

10. The calibration system of claim 7 wherein the intercept is equal to the first difference.

11. The calibration system of claim 8 wherein calculating the second slope is performed by the processor that is programmed to divide the third difference minus the second difference by the third input power minus the second input power.

12. The calibration system of claim 8 wherein the intercept is equal to the second difference.

13. A method for power amplifier (PA) calibration for an envelope tracking system of a wireless device comprising:
measuring an output power of a PA that is a part under test (PUT) at a predetermined input power;
calculating a gain equal to the output power of the PA divided by the predetermined input power;
calculating a gain correction by subtracting the calculated gain from a desired gain;
determining an expected supply voltage for the PA at the desired gain using the gain correction applied to a nominal curve of gain versus PA supply voltage;
storing the expected supply voltage for the PA versus input power in memory;
repeating the method steps until N expected supply voltages for the PA are stored;
determining an N difference between an expected PA supply voltage and a nominal PA supply voltage value for an N input power;
determining an N+1 difference between a measured PA supply voltage and a nominal PA supply voltage value for an N+1 input power;
calculating a slope and an intercept for a line that that yields calibration values as a function of PA supply voltage using the N difference, the N+1 difference, the N input power, the N+1 input power, and a nominal PA supply voltage for the N input power; and
storing the calibration values for PA supply voltage versus input power in a look up table memory that is accessible by the wireless device.

14. The method of claim 13 wherein the slope is calculated by dividing the N+1 difference minus the N difference by the N+1 input power minus the N input power.

15. The method of claim 14 wherein the intercept is equal to the N difference.

16. The method of claim 13 wherein the expected supply voltages are interpolated between the N input power and the N+1 input power.

17. The method of claim 13 wherein the expected supply voltages are extrapolated beyond the N input power and the N+1 input power.

* * * * *